(12) United States Patent
Sizov

(10) Patent No.: US 11,417,757 B2
(45) Date of Patent: Aug. 16, 2022

(54) OHMIC CONTACTS IN SEMICONDUCTOR DEVICES

(71) Applicant: Victor Sizov, Dresden (DE)

(72) Inventor: Victor Sizov, Dresden (DE)

(73) Assignee: X-FAB SEMICONDUCTOR FOUNDRIES GMBH, Erfurt (DE)

( * ) Notice: Subject to any disclaimer, the term of this patent is extended or adjusted under 35 U.S.C. 154(b) by 0 days.

(21) Appl. No.: 16/251,558

(22) Filed: Jan. 18, 2019

(65) Prior Publication Data
US 2019/0245073 A1    Aug. 8, 2019

(30) Foreign Application Priority Data

Jan. 19, 2018 (GB) .................................. 1800900

(51) Int. Cl.
| | | |
|---|---|---|
| *H01L 29/778* | (2006.01) | |
| *H01L 29/45* | (2006.01) | |
| *H01L 29/66* | (2006.01) | |
| *H01L 29/20* | (2006.01) | |
| *H01L 29/417* | (2006.01) | |
| *H01L 29/40* | (2006.01) | |
| *H01L 21/285* | (2006.01) | |

(52) U.S. Cl.
CPC .... *H01L 29/7786* (2013.01); *H01L 21/28575* (2013.01); *H01L 29/2003* (2013.01); *H01L 29/401* (2013.01); *H01L 29/41758* (2013.01); *H01L 29/452* (2013.01); *H01L 29/66462* (2013.01); *H01L 29/41766* (2013.01)

(58) Field of Classification Search
CPC ............. H01L 2924/00; H01L 29/2003; H01L 29/7786; H01L 29/66462; H01L 29/7787
See application file for complete search history.

(56) References Cited

U.S. PATENT DOCUMENTS

| | | | |
|---|---|---|---|
| 9,941,384 B2* | 4/2018 | You ..................... | H01L 29/7786 |
| 2011/0215415 A1 | 9/2011 | Gerhardt et al. | |
| 2011/0260174 A1 | 10/2011 | Francois | |
| 2013/0099324 A1 | 4/2013 | Huang et al. | |
| 2017/0294530 A1 | 10/2017 | Moens et al. | |
| 2017/0317183 A1 | 11/2017 | Kato | |

FOREIGN PATENT DOCUMENTS

| | | |
|---|---|---|
| EP | 2905811 | 8/2015 |
| WO | 2016/157371 | 6/2017 |

OTHER PUBLICATIONS

GB. Combined Search and Examinaton Report under Sections 17 and 18(3); Patent Application No. GB1800900.1, 8 pages (dated Jul. 3, 2018).
DE, First Office Action; German Patent Application Serial No. 102019101146.9, 8 pages dated (Aug. 5, 2020).

* cited by examiner

*Primary Examiner* — Tony Tran
(74) *Attorney, Agent, or Firm* — Thompson Hine LLP

(57) ABSTRACT

A semiconductor arrangement including a substrate, a dielectric layer, and a semiconductor layer disposed between the substrate and the dielectric layer. The arrangement further includes an ohmic contact including a plurality of metal contact fragments located in a plurality of trenches formed in the dielectric layer, and a metallic connector layer electrically connecting the metal contact fragments. The ohmic contact electrically connects the metallic connector layer to the semiconductor layer.

15 Claims, 32 Drawing Sheets

| 2101 | Forming a trench in a dielectric layer |

| 2102 | Forming within the trench a first layer of a first thickness on top of a semiconductor layer and a second layer of a second thickness on top of the first layer, wherein the first layer comprises a first metal, and the second layer comprises a first region disposed between a first trench wall and a first distance from the trench wall, a second region disposed between said first distance and a second distance from the trench wall, and a metal region disposed between said second distance and a second trench wall, wherein the first and third regions consist of the first metal and the second region consists of a second metal |
| 2104 | and wherein the second layer extends to a distance equal to the first thickness above an upper surface of the dielectric layer |

| 2103 | Annealing the metals to form an alloy |

Fig. 21

OHMIC CONTACTS IN SEMICONDUCTOR DEVICES

This application claims priority to UK Patent Application No. 1800900.1 entitled OHMIC CONTACTS IN SEMICONDUCTOR DEVICES and filed on Jan. 19, 2018, the entire contents of which are hereby incorporated by reference.

FIELD OF DISCLOSURE

The invention relates to ohmic contacts in semiconductor devices.

BACKGROUND

A high-electron-mobility transistor (HEMT) is a field-effect transistor incorporating a junction between two materials with different band gaps and lattice constants as the channel instead of a doped region. Such a junction is known as a hetero-junction. Thanks to the spontaneous polarization jump and/or piezoelectric field induced by crystal strain at the hetero-junction, a potential distortion occurs which forms a channel. In the case that the potential distortion is sufficient to form localization potential, the electrons are accumulated at the hetero-junction interface. These electrons form a layer known as a two dimensional electron gas. Within this region the electrons are able to move freely because there are no intentionally introduced doping or other scattering centers with which electrons will collide with significant impact into mobility and the mobility of the electrons in the gas is very high. In a GaN HEMT, doping is usually not used, and instead electrons are attributed to the states at the barrier surface.

A bias applied to the gate formed as a Schottky barrier diode is used to modulate the number of electrons in the channel formed from the 2D electron gas and in turn this controls the conductivity of the device. This can be compared to the more traditional types of FET where the width of the channel is changed by the gate bias. FIG. 1a is an energy momentum diagram 100 of a typical GaAs based HEMT. There is illustrated a larger bandgap semiconductor 101, a smaller bandgap semiconductor 102, donors 103 and electron gas 104. FIG. 1b shows a band diagram of a GaN HEMT.

FIG. 2 is a perspective view of an arrangement of a typical HEMT 200. There is a source 201, gate 202 and drain 203 as in any field effect transistor. The body 204 of the device comprises a substrate 205, a two-dimensional electron gas (2DEG) 206, a spacer 207, a barrier layer 208 and capping layers 209, 210.

Although they give good performance, the manufacture of HEMTs, and particularly the provision of low resistance ohmic contacts, is challenging. The channel layer, which enables the formation of the 2DEG, lies typically in the region of 1 to 50 nm below the surface of the barrier layer. This distance is too high to provide tunnelling carrier transport via an isolated barrier layer placed between the ohmic contact metal and channels. Special treatment is required involving creating a recess in the barrier layer and/or high temperature annealing. During annealing a chemical reaction between the ohmic metal stack and semiconductor takes place providing a low resistance ohmic contact. In order to implement such an approach, well-defined metals stacks thicknesses have to be controlled to provide a correct metal alloy composition, so that during annealing the required chemical reaction occurs. It limits freedom for designing the Front End of Line (FEOL) and Back End of Line (BEOL). In particular, a specific alloy composition desired for a metal contact may require extensive and expensive redesigning and testing to comply with the new metal deposition process.

SUMMARY

The invention provides semiconductor arrangements and methods of fabricating such, as set out in the accompanying claims. In one embodiment the invention is a semiconductor arrangement including a substrate, a dielectric layer, and a semiconductor layer disposed between the substrate and the dielectric layer. The arrangement further includes an ohmic contact including a plurality of metal contact fragments located in a plurality of trenches formed in the dielectric layer, and a metallic connector layer electrically connecting the metal contact fragments. The ohmic contact electrically connects the metallic connector layer to the semiconductor layer.

Certain embodiments will now be described, by way of example only, with reference to the accompanying figures.

BRIEF DESCRIPTION OF THE DRAWINGS

FIG. 21 is a flow chart showing the steps of manufacturing an ohmic contact in a semiconductor section according to an embodiment;

DETAILED DESCRIPTION

Embodiments will now be described more fully hereinafter with reference to the accompanying drawings, in which certain embodiments are shown. However, other embodiments in many different forms are possible within the scope of the present disclosure. Rather, the following embodiments are provided by way of example so that this disclosure will be thorough and complete, and will fully convey the scope of the disclosure to those skilled in the art.

Figure 1A:
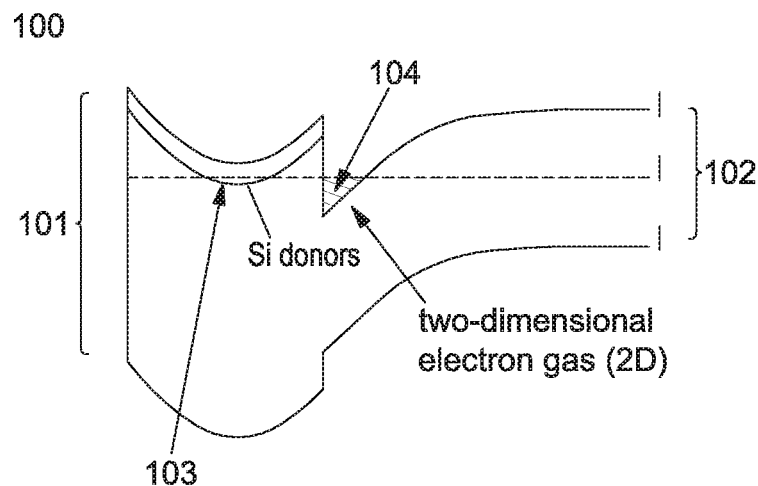
FIG. 1A is an energy momentum diagram illustrating the bandgaps of an HEMT.
Figure 1B:
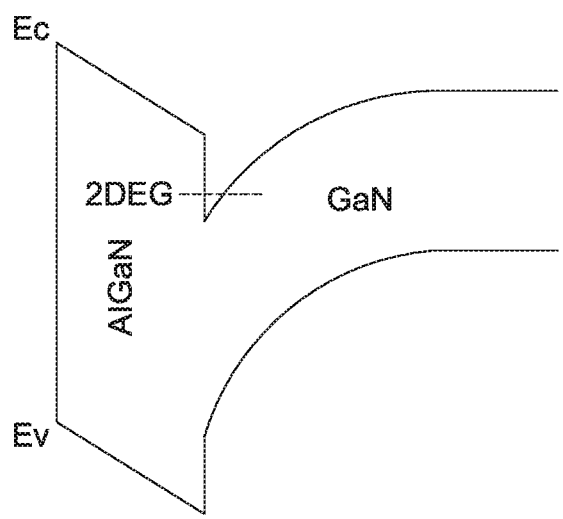
FIG. 1B is a band diagram of a GaN HEMT.
Figure 2:
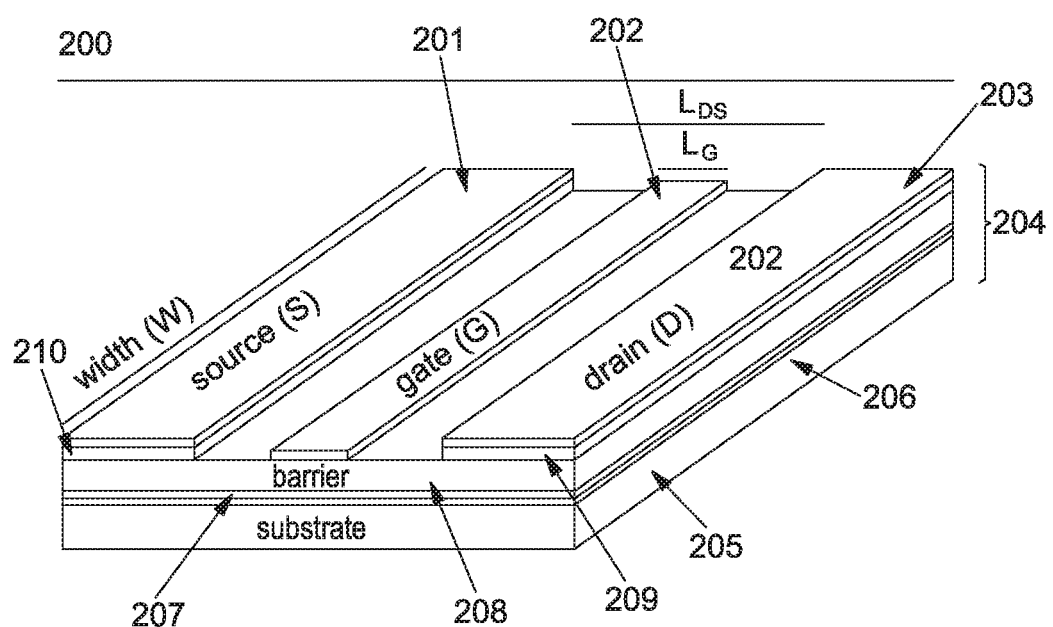
FIG. 2 is a cross-sectional view of a High Electron Mobility Transistor.
Figure 3:
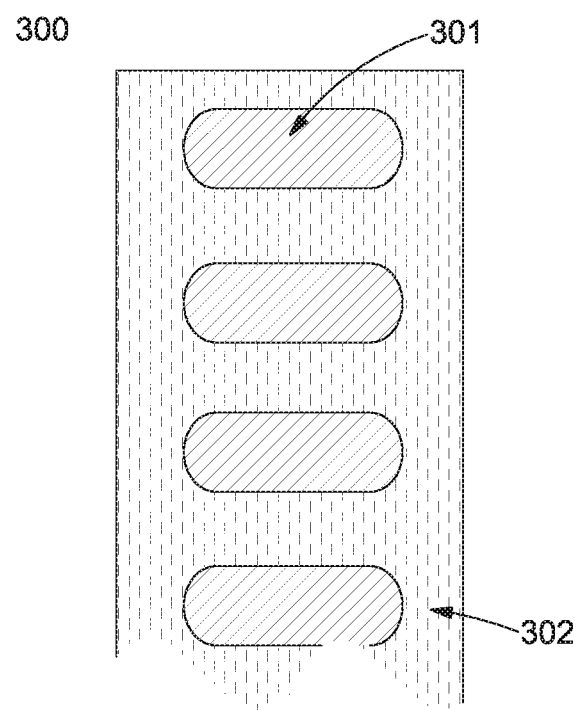
FIG. 3 is a plan view of a fragmented ohmic contact according to an embodiment.
Figure 4:
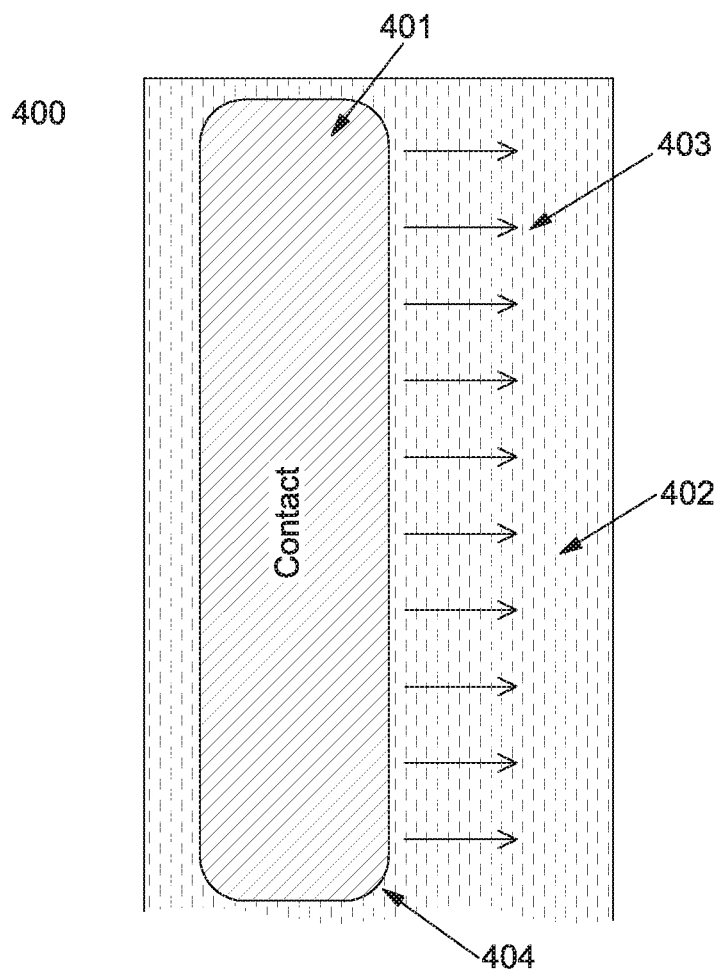
FIG. 4 is a plan view of the current flow from a conventional ohmic contact.
Figure 5:
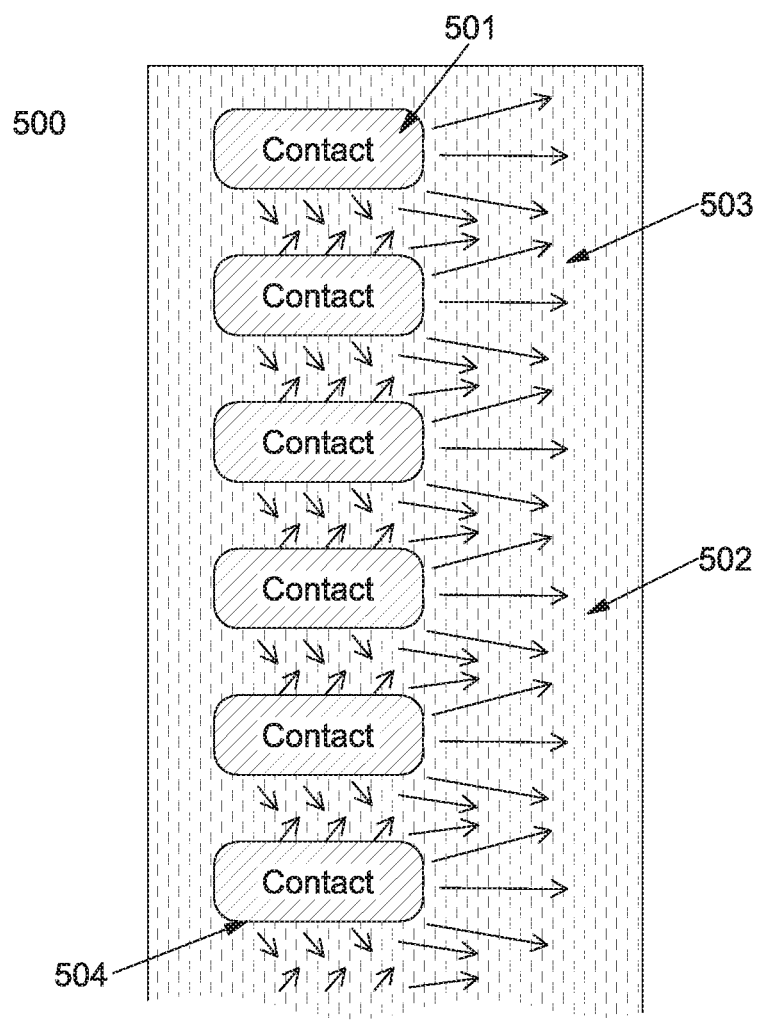
FIG. 5 is a plan view of the current flow from a fragmented ohmic contact according to an embodiment.

The present disclosure provides an improved ohmic contact and method of manufacture. The structure of the contact is based on the recognition that for an effective ohmic contact, the key parameter is not the area of the contact, but the perimeter which is in contact with the semiconductor with lateral topology of the devices. To take advantage of this phenomenon, an ohmic contact is provided that is fragmented into multiple sections, thus increasing the perimeter for a given area of contact. FIG. 3 is a plan view of a fragmented ohmic contact according to an embodiment. The fragmented ohmic contact structure 300 comprises a plurality of metallic contact fragments 301 located within a semiconductor layer 302. In an embodiment, all of the contact fragments are connected to a single external electrode, which provides a terminal to the semiconductor device. In an embodiment the arrangement illustrated in FIG. 3 is the terminal of a transistor, i.e. one of the gate, source or drain. An advantage of the fragmentation of the ohmic contact can be seen by comparison of the current flow from a conventional ohmic contact with that provided by a contact according to the present disclosure. FIG. 4 is a plan view showing the current flow from a conventional ohmic contact. FIG. 4 illustrates a single ohmic contact 401, conventionally arranged as a single block within the active region of the semiconductor device 402. The current 403 flows from the perimeter 404 of the contact. FIG. 5 is a plan view showing the improved efficiency of the fragmented contact, and shows the current flow from a fragmented ohmic contact according to an embodiment of the present disclosure. FIG. 5 illustrates the current flows 503 from the ohmic contact fragments 501 into the active region 502, due to the increase in the perimeter 504. By fragmenting the ohmic contact, an increase in the perimeter for a given overall area of contact is possible.

Figure 6:
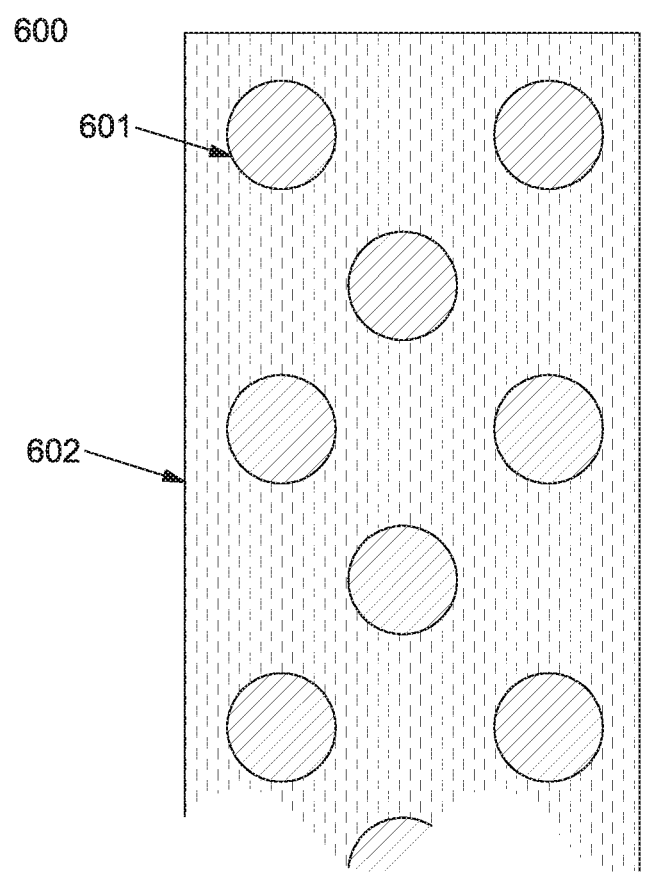
FIG. 6 is a plan view of a fragmented ohmic contact according to an embodiment.
Figure 7A:
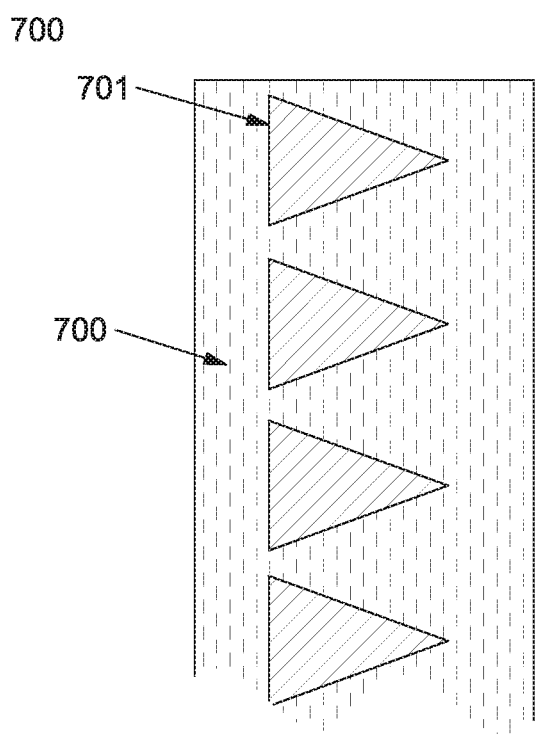
FIG. 7A is a plan view of a fragmented ohmic contact according to an embodiment.
Figure 7B:
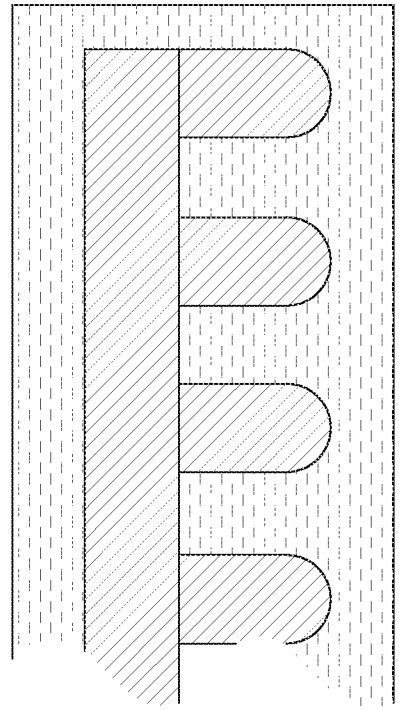
FIG. 7B is a plan view of a fragmented ohmic contact according to an embodiment.

Other configurations for the fragmented ohmic contact are possible. FIGS. 6, 7a and 7b are plan views of alternative embodiments. FIG. 6 illustrates an arrangement comprising ohmic contact fragments 601 with substantially circular shapes. FIG. 7a illustrates an arrangement comprising ohmic contact fragments 701 with substantially triangular shapes. The person skilled in the art will recognise that a very large number of such arrangements are possible which fall within the scope of the invention. The invention is not limited to any one arrangement of contact fragments. Importantly the contact fragments are not a plurality of (whole) ohmic contacts but a single ohmic contact that has been split into multiple contact fragments. A semiconductor device with multiple conventional ohmic contacts, such as the contact illustrated in FIG. 4, would not provide the technical benefit of the fragmented ohmic contact described herein.

Figure 8:
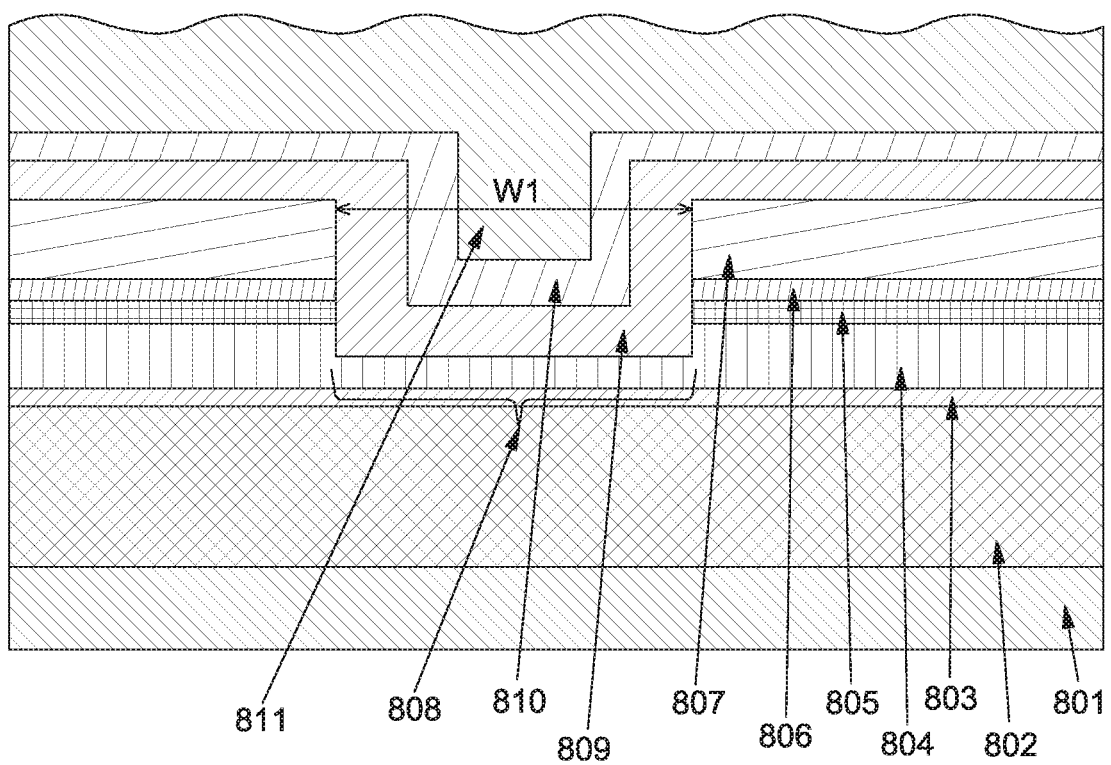
FIG. 8 is a cross sectional view of an ohmic contact embedded into the body of a semiconductor device according to an embodiment.

FIG. 8 is a cross-sectional view of a single ohmic contact fragment located within a semiconductor device, according to an embodiment. FIG. 8 illustrates the layers of the device, which comprise a substrate 801 and buffer 802. On top of the buffer is the spacer layer 803 (optional) and a barrier layer 804. In embodiments, there are also a number of optional layers, such as a cap layer 805, and one or more dielectric layers 806, 807. In an embodiment, the ohmic contact 808 comprises a metal stack with three metal layers 809, 810, 811. In an embodiment, the buffer layer comprises a stack of (Al)GaN layers with varied Al composition. In another embodiment, the buffer layer comprises InGaN with varied In composition. In yet another embodiment, the buffer layer comprises GaN. In an embodiment, the barrier layer comprises AlGaN. In an embodiment, at least one dielectric layers comprises SiN or $SiO_2$. The person skilled in the art will appreciate that any suitable semiconductor or dielectric material may be selected for each of the layers, and that the invention is not limited to any particular material or combination of materials.

In the embodiment illustrated in FIG. 8, the metal stack comprises three metal layers. In another embodiment, two metal layers are used. The person skilled in the art will appreciate that other arrangements are possible and that the invention is not limited to any particular arrangement of the metal stack. After deposition of the three metal layers 809, 810 and 811 the metals can be annealed to form an alloy (not shown). The alloy composition is critical to the device performance, and should be precisely controlled. However, instead of controlling the thickness of the deposited metal layers 809, 810 and 811 to achieve a particular composition, the shape and dimensions of the trench are chosen so as to provide a particular composition for a given (pre-determined) metal deposition process with specific metal layer thicknesses. This avoids having to adjust the metal deposition process, which in general is a well-established process for a given chip or device. Adjustments to the metal deposition process, such as changing the thickness of a metal layer, may require significant R&D.

Embodiments described herein can be useful, for example, in the case where a new contact is required on a particular chip, or a contact in the existing chip design requires a new alloy composition. Instead of redesigning the metal deposition process, which may require intensive testing to ensure that the new metal thicknesses work with the other device components and process steps, the contact can be split into contact fragments and the shape and dimensions of the fragments can be carefully adjusted/defined to provide the desired alloy composition. Hence, embodiments of the invention provide local control of the alloy composition of metal contacts without having to change the metal deposition process, i.e. without having to change the metal type or thickness of the deposited metal layers.

The process of creating the fragmented ohmic contact comprises forming trenches for filling with a metal stack. In an embodiment, the trenches are formed by etching the one or more dielectric layers, the cap layer (if present), and the barrier layer.

Figure 9:
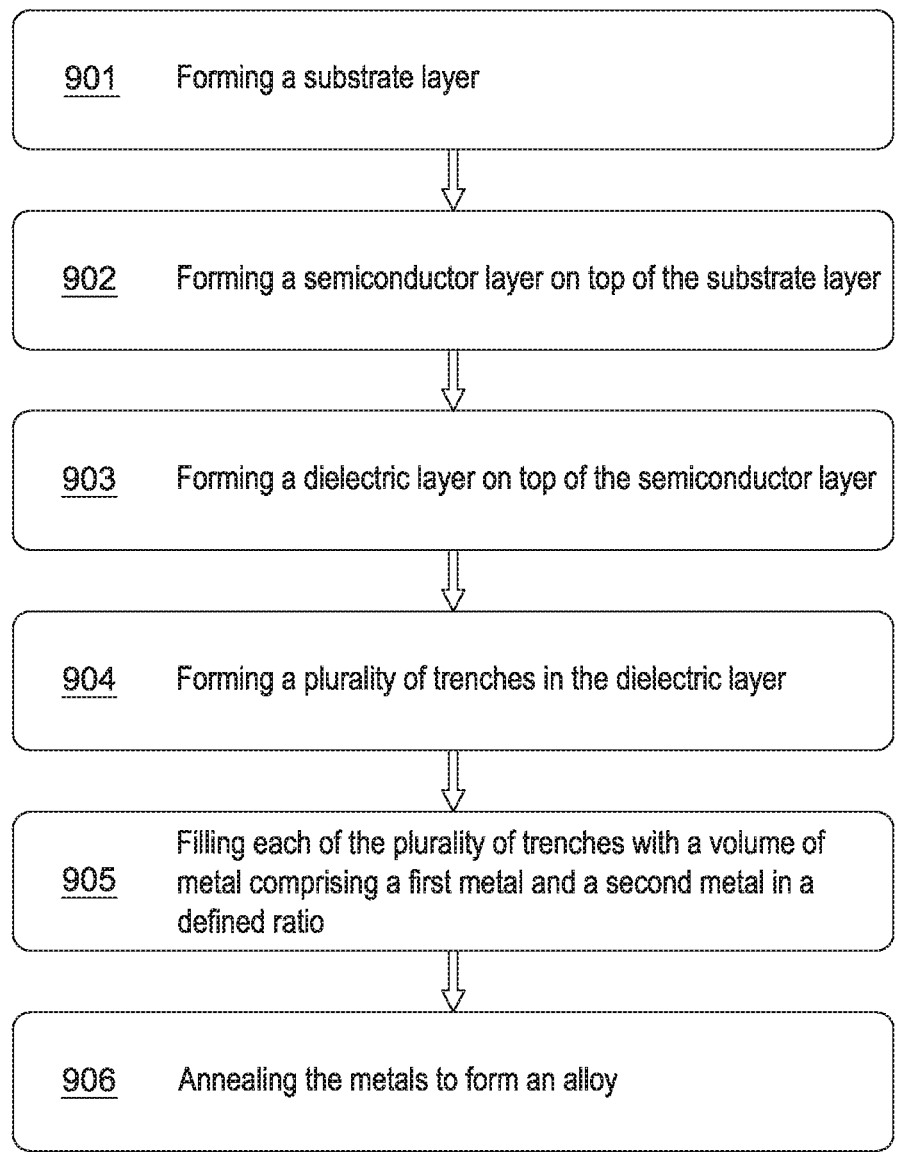
FIG. 9 is a flow chart of a method of constructing a semiconductor arrangement according to an embodiment.

FIG. 9 is a flow chart illustrating the steps of a method of constructing a semiconductor arrangement as described herein. The method comprises forming a substrate layer (901), forming a semiconductor layer on top of the substrate layer (902), forming a dielectric layer on top of the semiconductor layer (903), and forming a plurality of trenches in the dielectric layer (904). The plurality of trenches may also be formed in the semiconductor layer. The method further comprises filling each of the plurality of trenches with a volume of metal comprising a first metal and a second metal in a defined ratio (905), and annealing the metals to form an alloy (906).

Figure 10:
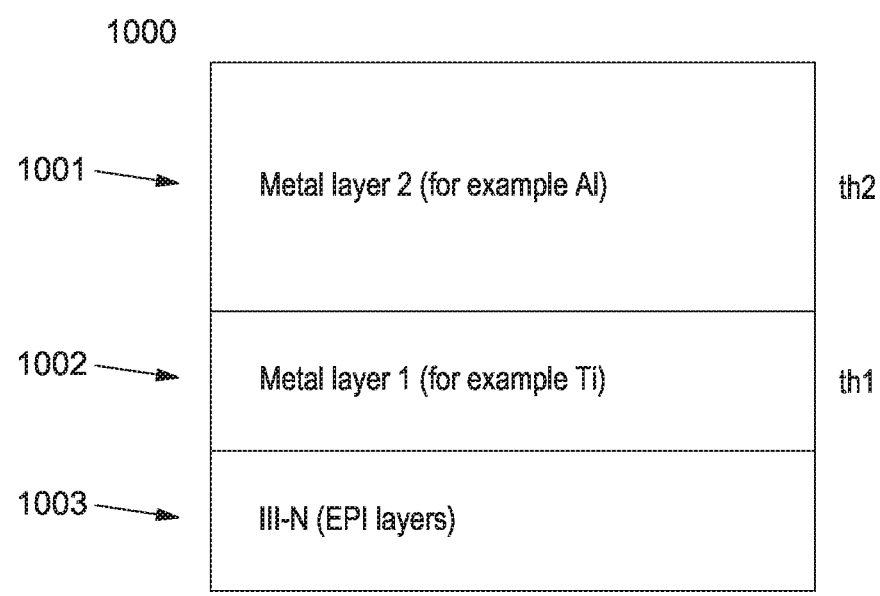
FIG. 10 is a cross sectional view of a metal stack for use in the manufacture of an ohmic contact.
Figure 11:
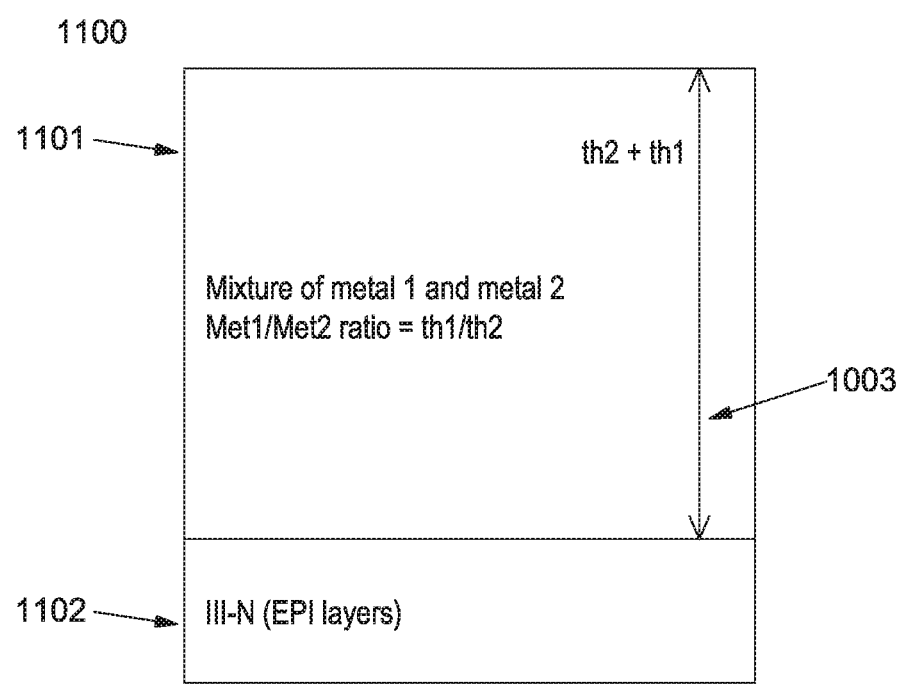
FIG. 11 is a cross sectional view of the stack of FIG. 9 after annealing.

Each of the plurality of trenches formed in step (904) may be a trench as illustrated in FIG. 8. The plurality of trenches may after the step of annealing (906) form the fragmented contacts 301, 501, 601 and 701 shown in FIGS. 3 and 5 to 7. FIG. 10 is a cross-sectional view of a metal stack for use in the manufacture of an ohmic contact. The stack consists of two metal layers, 1001, 1002 located on an EPI layer (typically III-N) 1003. FIG. 11 is a cross-sectional view of the stack of FIG. 10 after annealing. The composition of the metal alloy will be defined by the relative thicknesses of the metal layers 1001 and 1002 according to the following formula:

$$\text{Mixture of metal 1 and metal 2: Met1/Met 2} = th1/th2 \qquad \text{Equation 1}$$

In this equation $th1$ and $th2$ are the thicknesses of the metal layers 1002 and 1001 respectively, and Met1/Met2 is the ratio of the two metals in these layers.

Figure 12A:
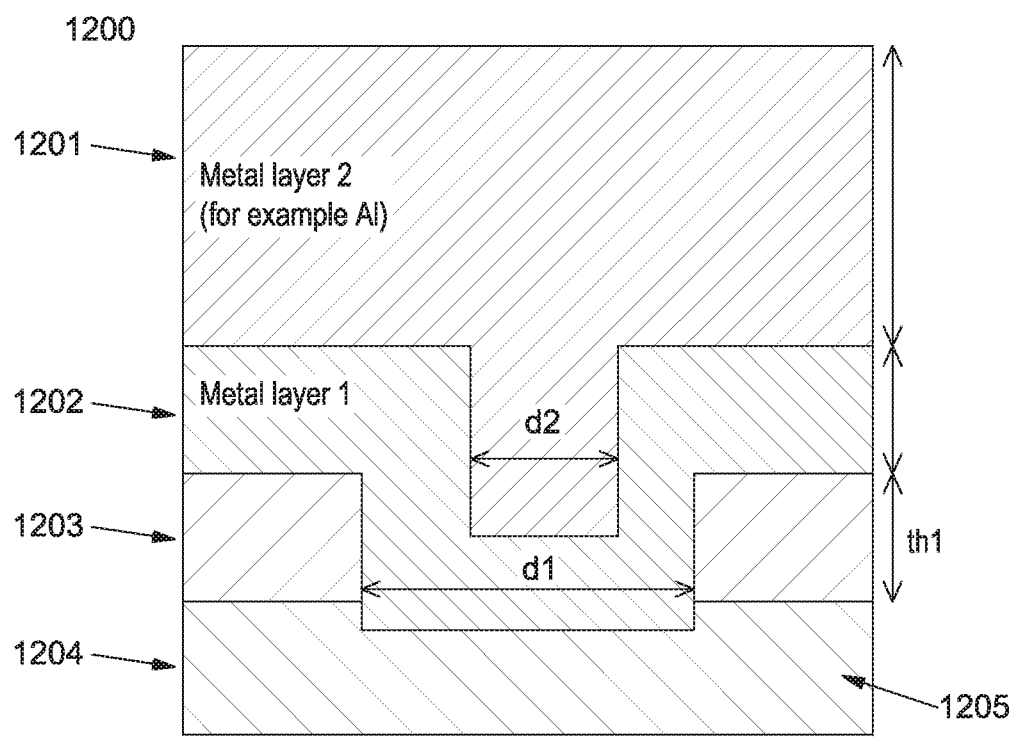
FIG. 12A is a cross sectional view of a metal stack for use according to an embodiment.

FIG. 12a is a cross-sectional view of a metal stack for use according to an embodiment. As in the conventional arrangement, there are two metals 1201, 1202 in the stack. However, in the embodiment of FIG. 12a, there is an additional dielectric layer 1203. There is a trench 1205 etched into the EPI layer 1204, which is filled with metal.

The process for constructing the ohmic contact is based on the following assumptions:
1) Metal diffusion is very small.
2) Metal deposition is conformal.
3) The metals get mixed completely within the trench.

The very low level of metal diffusion allows the composition in the trench to be different from that in the stack above the dielectric layer. The metal deposition being conformal means that the thickness of the metal layer 1 is constant along the dielectric and in the trench (thickness $th1$ in FIGS. 12a and 12b). This latter assumption means that a simple derivation of a formula for the alloy ratio in the trench is possible. The ratio is given by the cross sectional areas of the respective metal components.

The contact fragment illustrated in FIG. 12a may be formed by the method illustrated in FIG. 9. The EPI layers 1204, the dielectric layer 1203, the trench 1205 and the metal layers 1202 and 1201 may be formed in steps (902), (903), (904) and (905) respectively. FIG. 12a may illustrate one of the fragments of the plurality of metal contact fragments in FIG. 3, but before annealing. The width (d1) of the trench 1205 corresponds to the width perpendicular to the current direction as shown in FIG. 5.

Figure 12B:
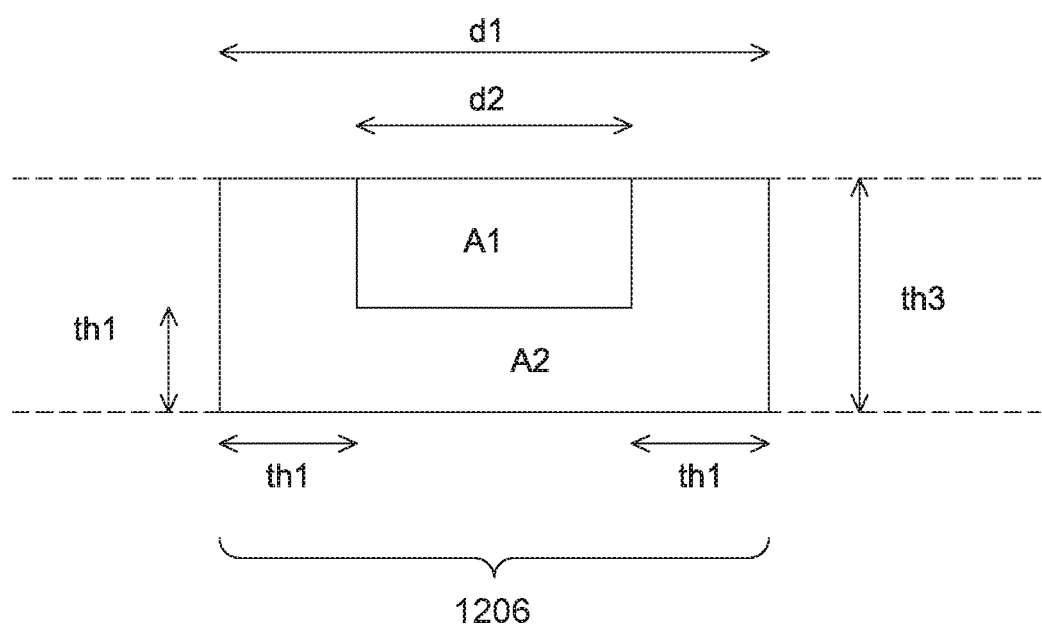
FIG. 12B is a cross sectional view of the trench of FIG. 12A.

FIG. 12b is a cross section of the trench 1206 of FIG. 12a. Area A1 is the cross sectional area of the section consisting of metal 1 and A2 is the cross sectional area of the section consisting of metal 2. Area A1 is given by:

$$A1=(th3-th1)\times d2 \qquad \text{Equation 2}$$

$$A2=(th3\times d1)-(th3-th1)\times d2 \qquad \text{Equation 3}$$

The ratio of the areas and hence the ratio of the metals is therefore given by:

$$\text{Metal2/Metal 1}=(th3-th1)\times d2/((th3\times d1)-(th3-th1)\times d2) \qquad \text{Equation 4}$$

$$d2 \text{ is given by: } d2=(d1-2\times th1) \qquad \text{Equation 5}$$

Hence the metal ratio of the alloy in the trench is given by:

$$\text{Metal2/Metal 1}=(th3-th1)\times(d1-2\times th1)/((th3\times d1)-(th3-th1)\times(d1-2\times th1)) \qquad \text{Equation 6}$$

Hence the ratio of the metals is determined by the thickness of the dielectric, the width of the trench and the thickness of the layer comprising metal 1.

The above formula is valid in a two dimensional system or in a system where the length of the contact fragment (i.e. the lateral distance in the direction of the current) is much greater than the thickness of the metal layers so that edge effects become negligible.

Figure 13A:
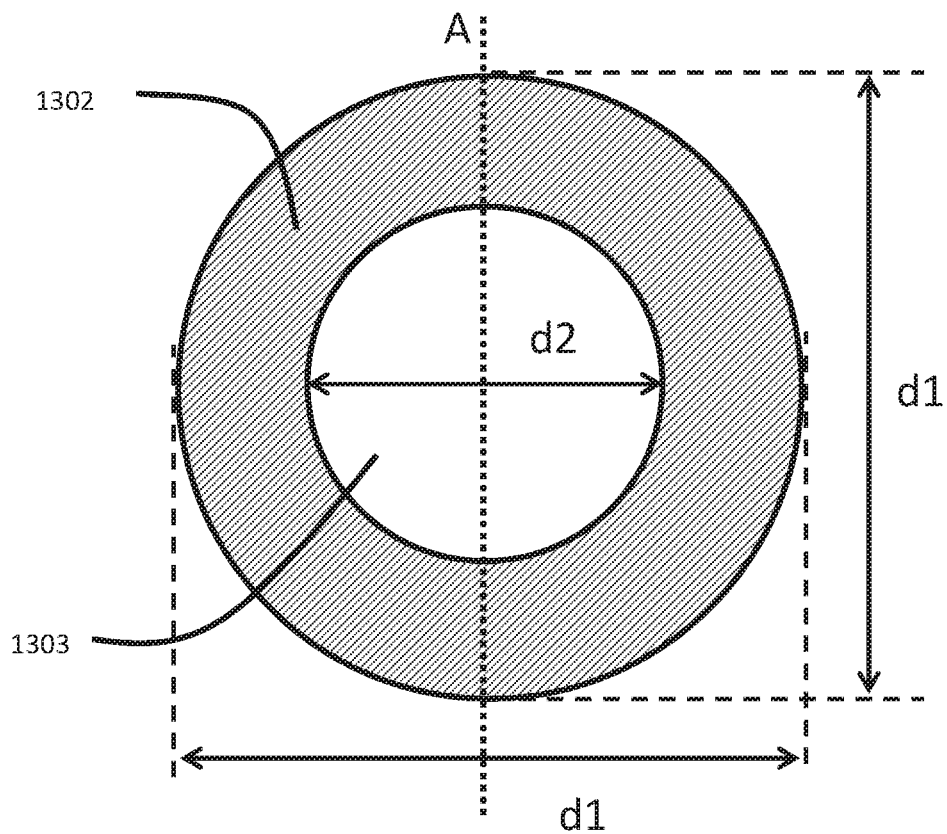
FIG. 13A is a top view of a cylindrical metal contact fragment before annealing.
Figure 13B:
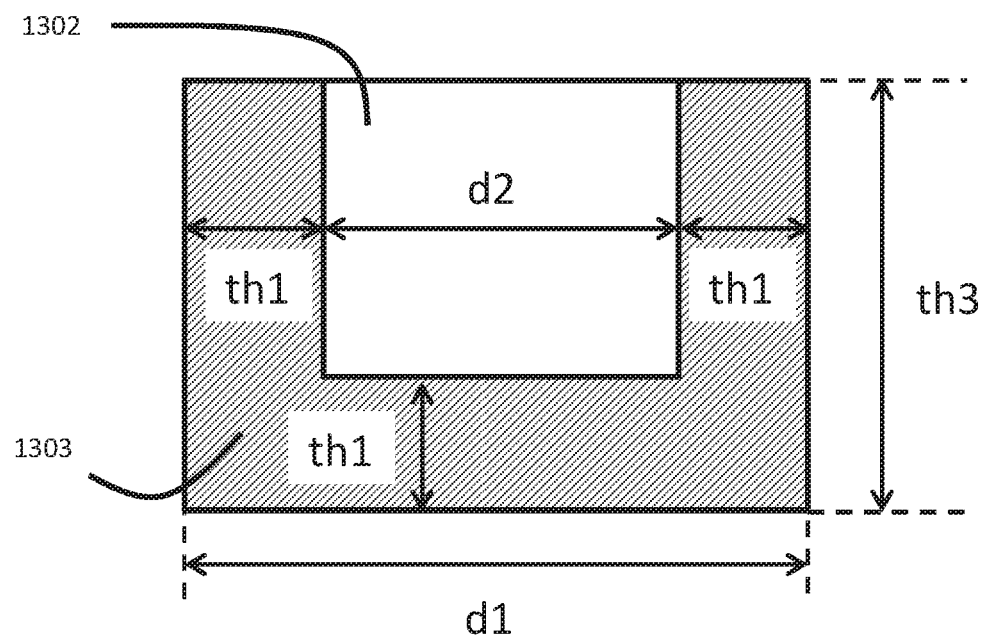
FIG. 13B is a cross sectional view of the cylindrical metal contact fragment of FIG. 13A.

In general, for a three dimensional contact, the volumes of the metals need to be calculated to determine the alloy composition. FIG. 13a shows a top view of a cylindrical contact fragment (e.g. one of the fragments of the ohmic contact illustrated in FIG. 6) before annealing the metals 1302, 1303 (metals 1 and 2) to form an alloy. FIG. 13b shows a cross section of the same cylindrical contact fragment taken along the dotted line A in FIG. 13a. The alloy composition after annealing can be calculated as follows:

$$\text{Metal2/Metal1}=(\text{Volume of metal 2})/(\text{Volume of metal 1});$$

$$\text{Volume of metal 1}=\pi\times(d2/2)^2\times(th3-th1);$$

$$\text{Volume of metal 2}=\pi\times(d1/2)^2\times th3-(\text{Volume of metal 1}).$$

Figure 14:
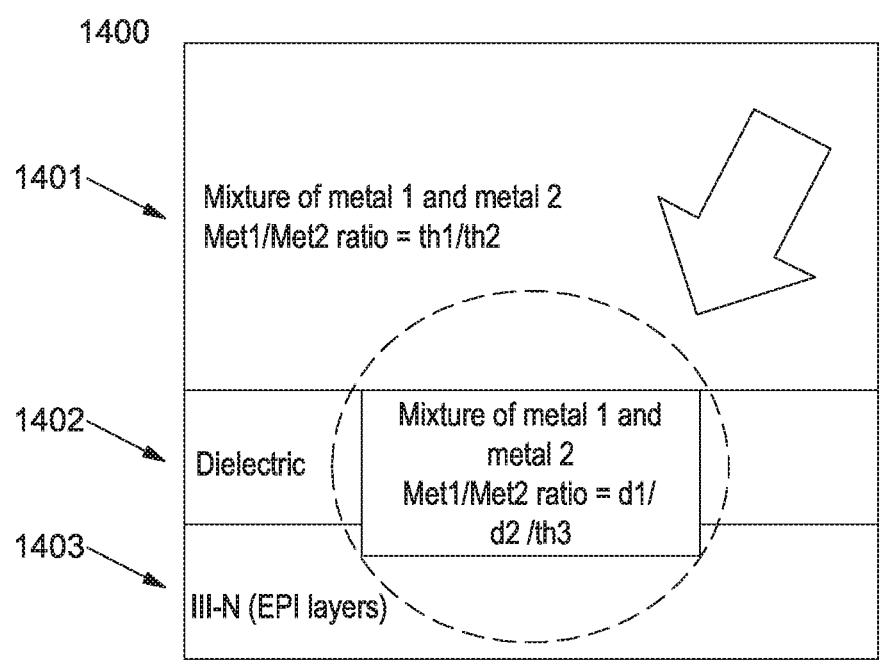
FIG. 14 is a cross sectional view of the embodiment of FIG. 12A after the annealing process is completed.

The above equations can be adjusted for calculating the alloy composition of a metal contact fragment of any given shape and size. FIG. 14 is a cross-sectional view 1400 of the embodiment of FIG. 12a after the annealing process is completed. In the region 1401 above the dielectric 1402, the composition of the alloy is the same as in the conventional process. However, within the trenches, the composition is different.

The local control of alloy composition of metal contacts also allows multiple ohmic contacts with different compositions to be manufactured on the same chip and in the same process steps. It may be that the requirements of different contacts on the same chip differ, for example, depending on the purpose of the contact in the finished device. A contact used for radio frequency applications may have different requirements and priorities compared to a contact used for power applications. For example, a low resistance may be prioritized in one contact, while physical stability rather than resistance is more important in another. In an embodiment, both of these contacts are formed in the same metal deposition process by using appropriate shapes and dimensions for the contact fragments of each of the two different contacts.

The transfer length is the average length that a carrier travels within the semiconductor under the contact before it flows into the contact. In a bulk semiconductor, the transfer length depends on the vertical resistance between the contact and the semiconductor and the resistance of the semiconductor under the contact. Another way of defining the transfer length is as the minimum length (in the current direction) of the contact at which the current saturates (i.e. at which the current does not continue to increase with increasing length significantly, not more than 10% for double length). For example, the resistance or current between two contacts can be measured or calculated while increasing the contact lengths. At first the resistance drops rapidly as the increasing length (and contact area) increases the number of injected electrons. Then the change in resistance becomes slower and eventually saturates (i.e. stops decreasing). The length of the contact where the resistance (substantially) stops changing (i.e. where the change is less than 10% as the length of the contacts is doubled) can be taken as the transfer length or as an approximation of the transfer length. This way of determining the transfer length may be more practical for finding an optimal contact length or overall contact design.

Figure 15:
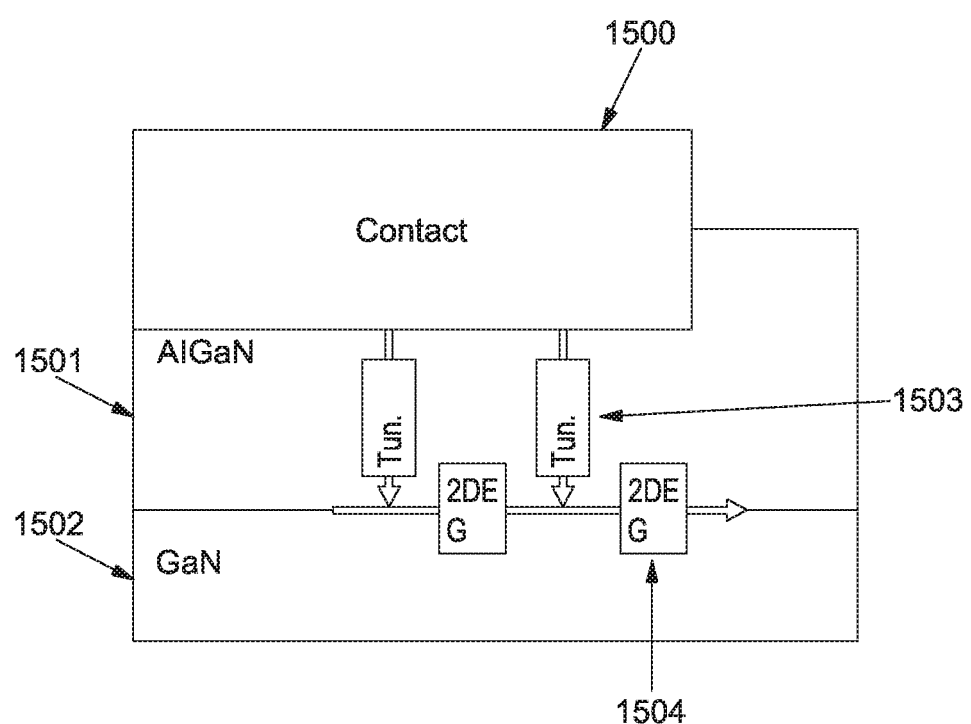
FIG. 15 is a cross sectional view of a contact, showing the relevant resistances.
Figure 16:
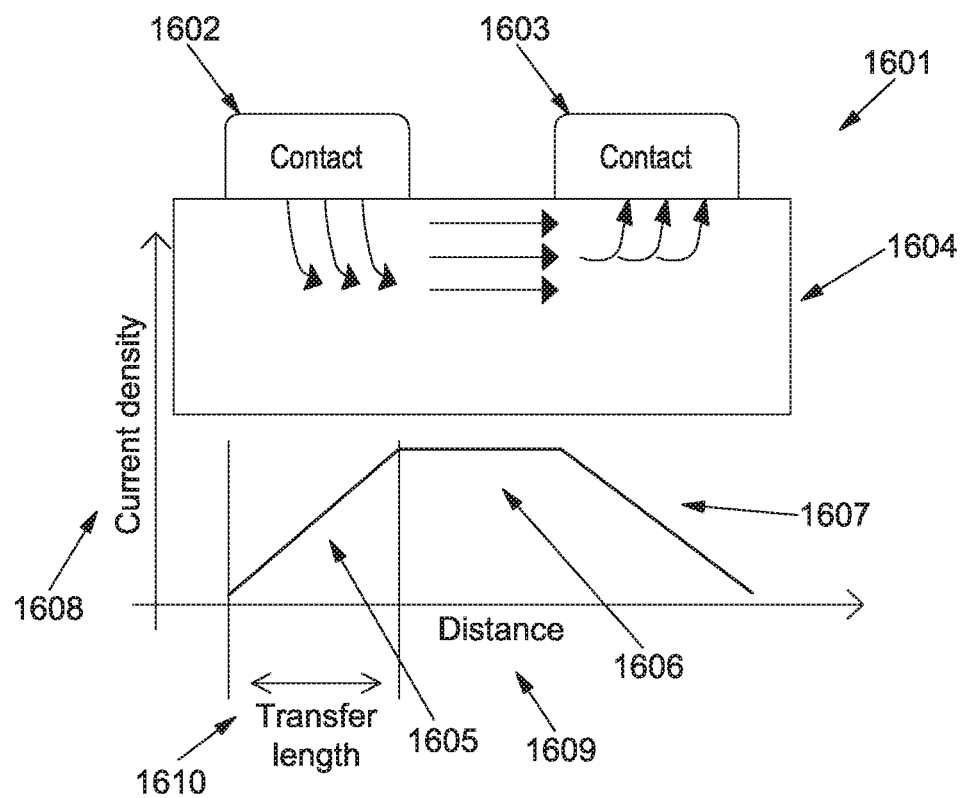
FIG. 16 is a graphical illustration of the current density against length in such an arrangement.

FIGS. 15 and 16 show a contact in a GaN HEMT, in which the AlGaN barrier is not completely etched. In this case, the transfer length depends on the vertical resistance of the AlGaN barrier (1501) between contact (1500) and the 2DEG (located at the 1502/1501 interface) and the 2DEG lateral resistance.

FIG. 15 is a cross-sectional view of a contact, showing the relevant resistances. A metallic contact 1500 is located on top of a first semiconductor layer 1501, which in an embodiment is Aluminium Gallium Nitride, which in turn is located on top of a second semiconductor layer 1502, which in an embodiment is (Al)GaN. The person skilled in the art will appreciate that other semiconductors may be used and the invention is not limited to particular materials for either layer. The vertical resistance 1503 and the semiconductor or 2DEG resistance 1504 are shown in FIG. 15. If the semiconductor or 2DEG resistance is much higher than the vertical resistance then the transfer length is very short. Conversely, a contact with a vertical resistance much higher than the semiconductor or 2DEG resistance would result in a very long transfer length.

FIG. 16 is a graphical illustration of the current density against length in such an arrangement. Above the graph is a cross section of a typical semiconductor device 1601, comprising contacts 1602, 1603 and a semiconductor section 1604. Current movement from the first contact to the semiconductor 1605, within the semiconductor 1606 and from the semiconductor to the second contact 1607, are illustrated. In the graph below, current density 1608 is plotted against distance 1609, with the transfer length 1610 indicated. The optimal contact size in approximately the same as the transfer length. This enables the area of the contact to be used most efficiently.

Figure 17:
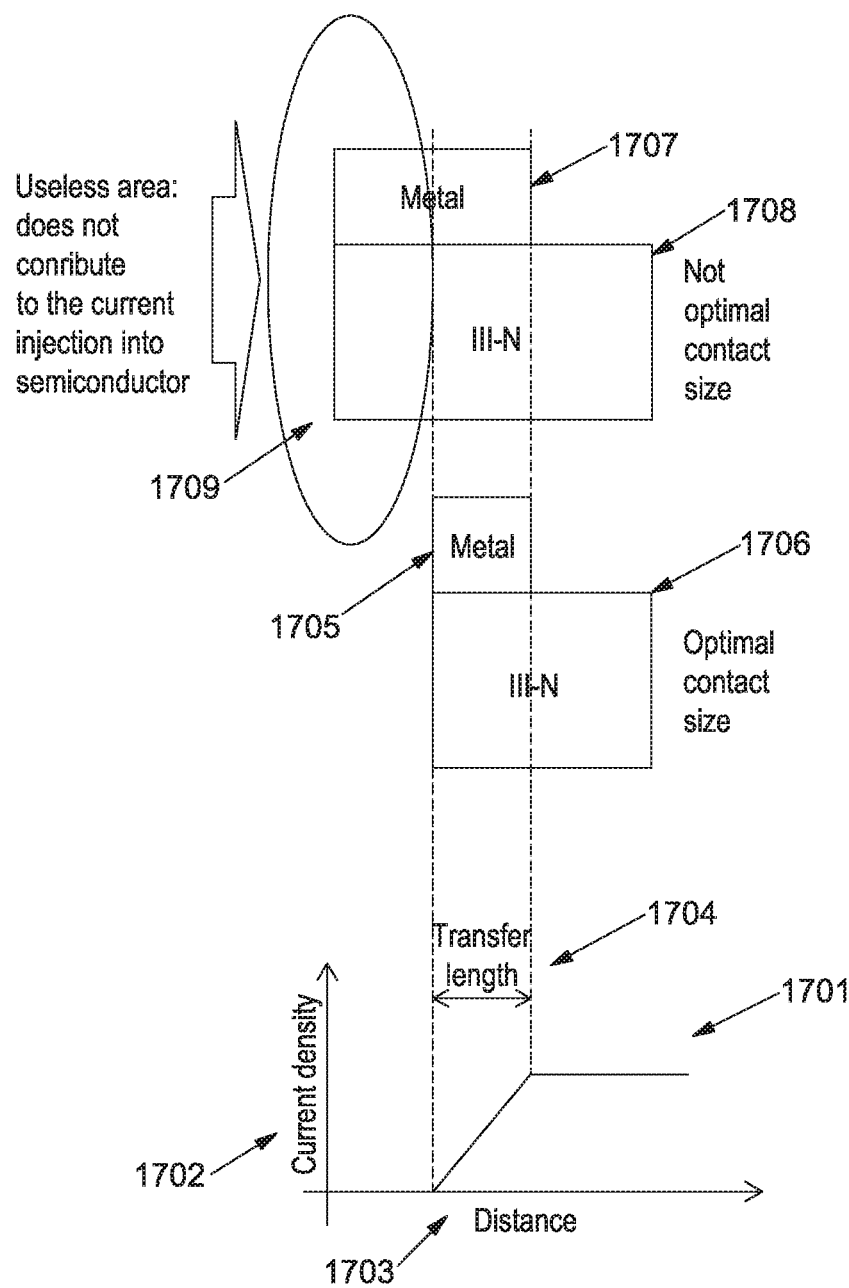
FIG. 17 is a cross sectional representation of two ohmic contacts of different size.

FIG. 17 is a cross sectional representation of two ohmic contacts of different size, illustrating optimal contact size. For reference, a graphical representation 1701 of current density 1702 against distance 1703 is provided, which shows the transfer length 1704. Two contacts, the first contact 1705, located on a semiconductor section 1706, and a second contact 1707, located on a semiconductor section 1708, are illustrated. The first contact 1705 is of optimal size, being approximately the size of the transfer length. That is, at least one dimension of the ohmic contact 1705 is substantially equal to the transfer length 1704. For example, said dimension may be within 10% of the transfer length 1704, or preferably within 5% of the transfer length 1704. The second contact 1707 is larger than the transfer length, and therefore has a useless section 1708, which does not contribute to current injection into the semiconductor.

Figure 18A:
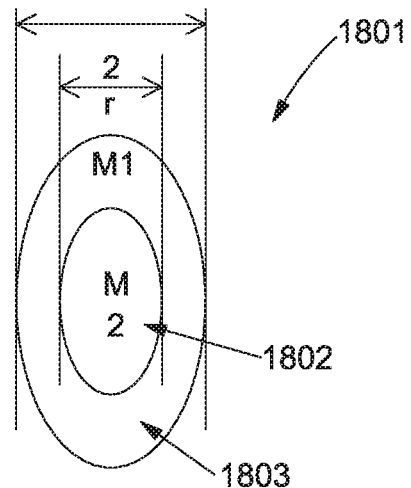
FIG. 18A is a plan view of a cylindrical ohmic contact fragment.
Figure 18B:
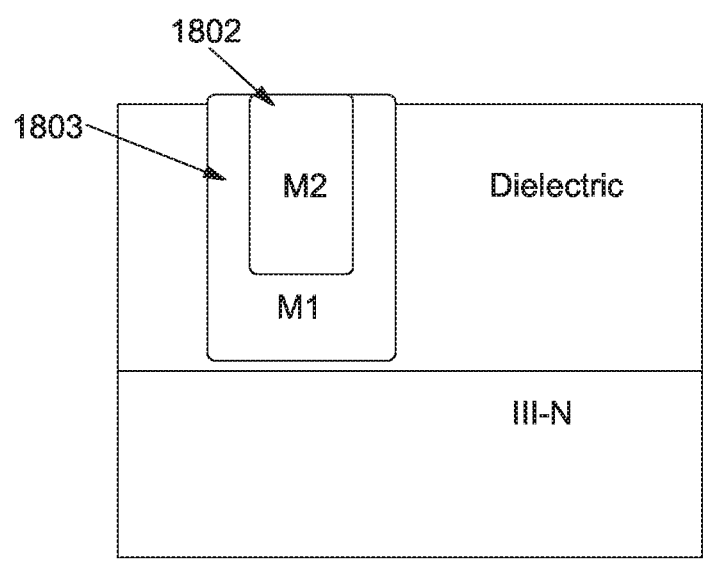
FIG. 18B is a cross sectional view of the same embodiment.
Figure 19A:
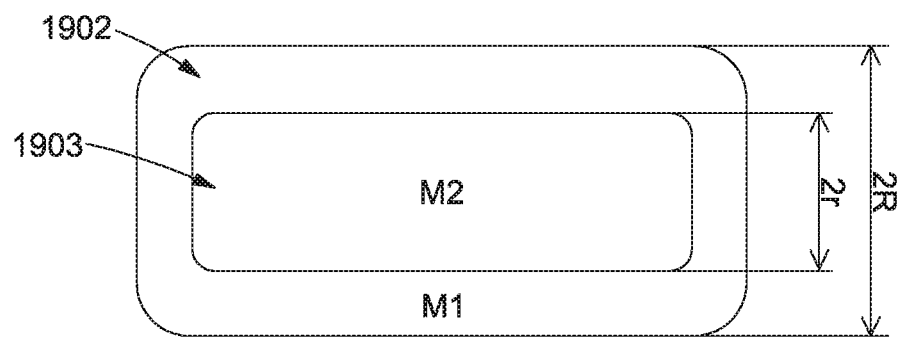
FIG. 19A is a plan view of an ohmic contact fragment according to another embodiment.
Figure 19B:
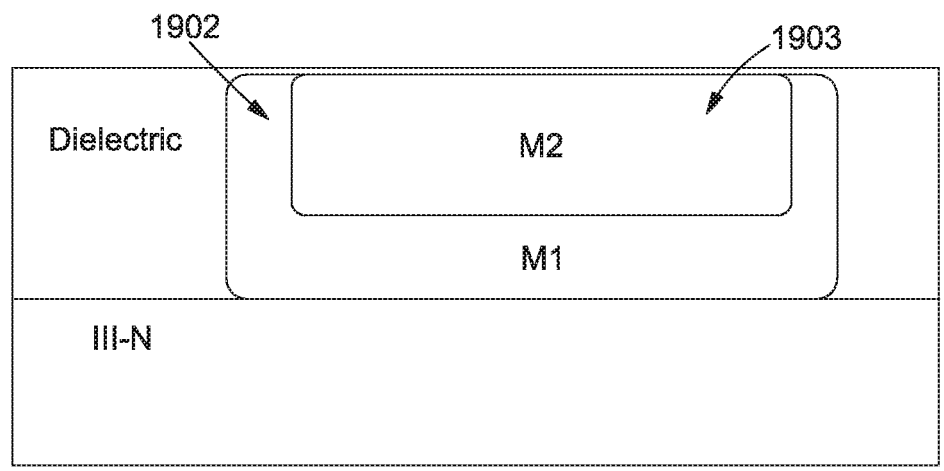
FIG. 19B is a cross sectional view of the embodiment of FIG. 19A.

A further degree of design freedom is the shape of the contacts. FIG. 18(a) is a plan view of a cylindrical ohmic contact fragment 1801. FIG. 18(b) is a cross sectional view of the same embodiment. The radius of the cylinder should be approximately equal to the transfer length. FIGS. 18(a) and (b) illustrates the pre-annealing arrangements of the first metal M1 1802 and the second metal M2 1803 which are the constituent metals of the alloy to be formed by annealing. FIG. 19(a) is a plan view of an ohmic contact fragment according to another embodiment. In the embodiment of FIG. 19(a), the ohmic contact has an obround surface. FIG. 19(b) is a cross sectional view of the embodiment of FIG. 19(a). FIGS. 19(a) and (b) illustrates the pre-annealing arrangements of the first metal M1 1902 and the second metal M2 1903 which are the constituent metals of the alloy to be formed by annealing. The embodiments of FIGS. 18 and 19 comprise an ohmic contact fragments shaped as right circular cylinder and an obround respectively. However, the person skilled in the art would appreciate that there are a very large number of possible alternative shapes that could be used, such as a cuboid, a triangular based section etc.

Figure 20A:
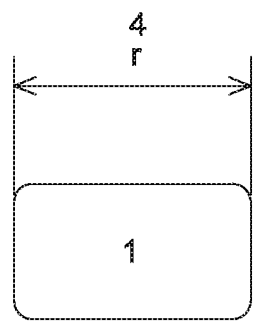
FIG. 20A is a plan view of an ohmic contact with an obround shape.
Figure 20B:
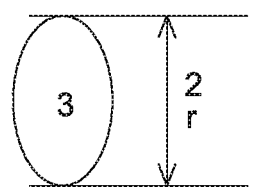
FIG. 20B is a plan view of an ohmic contact with an elliptic shape.
Figure 20C:
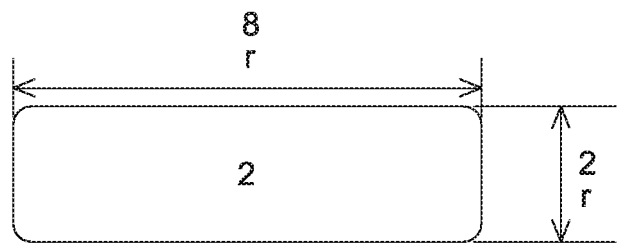
FIG. 20C is a plan view of an ohmic contact with an obround shape with a greater length to width ratio than the embodiment of FIG. 20A.

Since the current density under the contact area decreases away from the edge of the contact, it is beneficial to have the shape with the higher perimeter/area ratio. FIGS. 20(a), 20(b) and 20(c) are plan views of ohmic contacts with different shapes, illustrating this principle. FIG. 20(a) illustrates a contact with an obround shape. The ratio of the perimeter to area is approximately:

$$\text{Perimeter to area ratio} = 3/(2*r) \quad \text{Equation 7}$$

FIG. 20(b) illustrates a contact with a circular shape. The ratio of the perimeter to area is approximately:

$$\text{Perimeter to area ratio} = 5/(4*r) \quad \text{Equation 8}$$

FIG. 20(c) illustrates a contact with an obround shape, but with a greater length to width ratio than the embodiment of FIG. 20(a). The ratio of the perimeter to area is approximately:

$$\text{Perimeter to area ratio} = 2/r \quad \text{Equation 9}$$

The optimal shape of contact for creating an alloy with the desired local metal composition may be however different to the shape required to provide the optimal perimeter to area ratio. Hence there is a trade-off for each combination of metal stack, between the requirements for annealing condition, EPI material, device design and other parameters in order to produce the optimal shape for providing the best ohmic contact performance.

The spacing between fragments, or the density of fragments, also affects the resistance and thereby the performance of the contact. Hence, the layout of fragments, and not just the shape and dimensions of individual fragments, is important. If the fragment density is too high, then the current will be saturated. For example, in the limiting case where the spacing between fragments tends towards zero, the fragmented ohmic contact behaves like a normal (non-fragmented) ohmic contact. If the density is too low, on the other hand, then the contact is not making full use of the space provided. The optimal spacing depends on many factors, including 2DEG channel sheet resistance between fragments, but, in general, has been found to fall within the range of 0.1 to 10 times the transfer length of the metal contact fragment.

Apart from the spacing, the layout also comprises the pattern of fragments. For example, for fragments with a rectangular or obround profile it may be advantageous to arrange each fragment in a single row (e.g. as in FIG. 3). For cylindrical contact fragments, a greater number of smaller fragments arranged in multiple rows (e.g. in a hexagonal pattern as shown in FIG. 6) can provide better performance.

According to an embodiment the method of manufacturing a fragmented ohmic contact comprises the following steps:

a) For a given metal deposition process, comprising the at least two different metal types (e.g. Ti and Al), determining an optimal or otherwise desired metal contact alloy composition comprising those metal types. The optimal composition will depend upon the EPI material, annealing conditions and the purpose of the contact in the finished semiconductor device.

b) Determining or approximating the transfer length of an ohmic contact with the determined metal contact alloy composition. Once the alloy composition is known, the transfer length can be calculated or approximated.

c) Determining a metal contact fragment area and a fragment layout that provide optimal contact behavior for the given area that is to be covered by the plurality of fragments (i.e. the area of the whole ohmic contact). As previously discussed, the resistance of the contact is decreased by the greater perimeter to area ratio of the fragmented ohmic contact. This step of determining the area and layout/spacing of contact fragments may comprise analytical modeling of the contact, wherein the parameters that minimize the resistance of the modeled contact are used.

d) Determining the optimal combination of shape, dimensions and layout of the contact fragments, such that
  i. the alloy composition in each fragment is equal or close to the optimal or otherwise desired alloy composition (from step a)
  ii. the length of each fragment is equal or close to the determined transfer length (from step b); and
  iii. the area of each fragment and the layout of fragments is close or equal to the area and layout determined to provide optimal contact behavior (from step c).

e) Forming an ohmic contact comprising a plurality of contact fragments with the optimal combination of shape, dimensions and layout (from step d).

The step of forming the fragmented ohmic contact (step e) is described in more detail below.

FIG. 21 is a flow chart showing the steps of manufacturing an ohmic contact in a semiconductor section. The section may comprise one or more layers, such as a dielectric layer, a buffer layer, and a barrier layer. The person skilled in the art will appreciate that the method is applicable to different types of semiconductor sections and that the invention is not limited to any particular arrangement of layers. The method comprising the steps of forming a trench in a dielectric layer (and optionally in a semiconductor layer) (2101) this is generally one of a plurality of trenches used to form the fragmented ohmic contact, forming within the trench a first layer of a first thickness on top of a semiconductor layer and a second layer of a second thickness on top of the first layer, wherein the first layer comprises a first metal, and the second layer comprises a first region disposed between a first trench wall and a first distance from the trench wall, a second region disposed between said first distance and a second distance from the trench wall, and a metal region disposed between said second distance and a second trench wall, wherein the first and third regions consist of the first metal and the second region consists of a second metal (2102). Optionally, the first and second layers are formed so that the second layer extends to a distance equal to the first thickness above an upper surface of the dielectric layer (2104). The method further comprises annealing the metals to form an alloy (2103).

Figure 22:
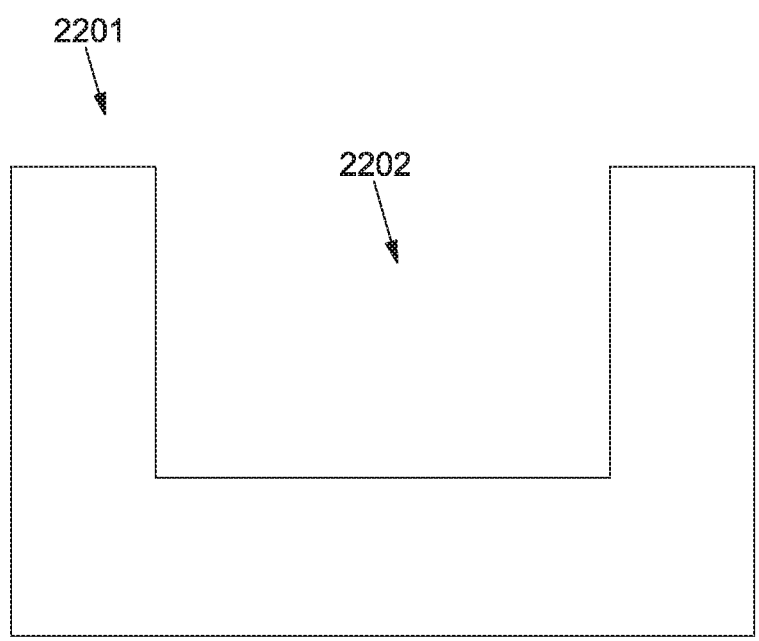
FIG. 22 is a cross section of a semiconductor section illustrating the result of a first step of a method according to an embodiment.
Figure 23:
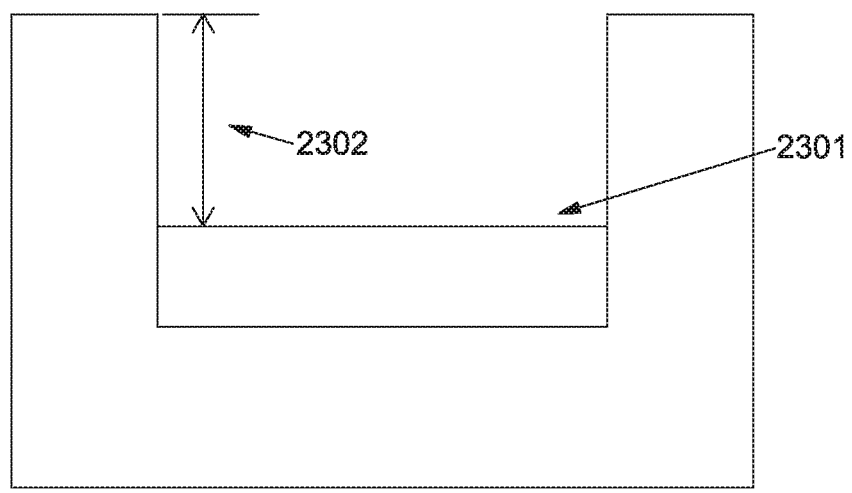
FIG. 23 is a cross section of a semiconductor section illustrating the result of a second step of a method according to an embodiment.
Figure 24:
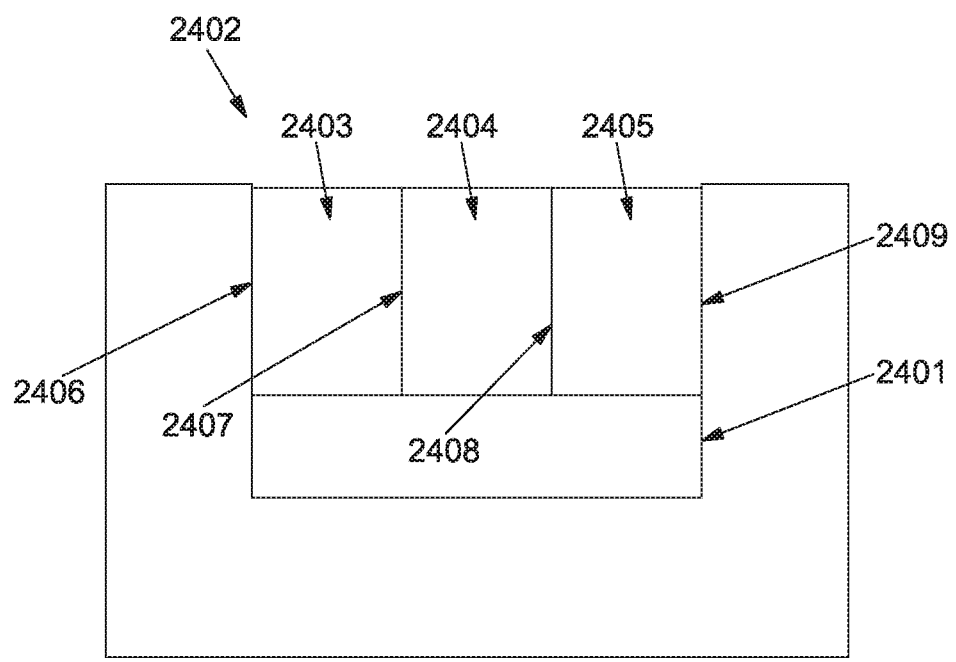
FIG. 24 is a cross section of a semiconductor section illustrating the result of a third step of a method according to an embodiment.

The stages of the construction of the ohmic contact are illustrated in FIGS. 22 to 24. FIG. 22 is a cross section of a semiconductor section 2201 illustrating the result of the first step (2001) of the method according to an embodiment. A trench 2202 has been formed in the section 2201. FIG. 23 is a cross section of the semiconductor section after the second stage (2002) has been completed. A first metal layer 2301 has been formed in the trench to a first depth 2302. The first metal layer comprises a first metal. In an embodiment, the first metal is titanium However, the person skilled in the art will appreciate that a wide range of metals are suitable and the invention is not limited to any one metal. A wide range of options is provided in Tables 1 and 2.

FIG. 24 is a cross sectional view of the semiconductor section after the completion of the third stage (2004) of the method according to an embodiment. Above the first metal layer 2401, a second metal layer 2402 has been formed. This second layer comprises three regions. The first region 2403 comprises the first metal, the second region 2404 comprises the second metal (e.g. Aluminium) and the third region 2405 comprises the first metal. The first region extends from a first side 2406 of the trench to a first distance 2407. The second region extends from the first distance 2407 to a second distance 2408. The third region extends from the second distance 2408 to a second side of the trench 2409, the second side being opposite to the first side. Although shown as separate steps in FIGS. 22 to 24, the regions 2403 and 2405 are generally formed at the same time as the first metal layer 2401.

Table 1 shows a selection of possible metal stacks which may be formed and the associated contact resistances that can be expected. The skilled person will appreciate that the invention is not limited to this selection of alloys. Table 2 shows another selection of possible metal stacks to form ohmic metal on AlGaN without the use of gold (Au).

TABLE 1

Ohmic contacts to AlGaN/GaN heterostructures

| Metal Layers (nm) | $d_{AlGaN}$ (nm) | $\chi_{AL}$ (%) | Annealing conditions | $\rho$ ($\Omega cm^2$) |
|---|---|---|---|---|
| Ti/Al (30/71 nm) | 33 nm | 15% | 950° C. for 20 s in $N_2$ | $2.2 \times 10^{-5}$ |
| Ti/Al (30/71 nm) | 33 nm | 15% | 950° C. for 20 s in $N_2$ (with pre-annealing) | $3.2 \times 10^{-6}$ |
| Ti/Al (20/150 nm) | 34 nm | 22% | 950° C. for 10 min in $N_2$ | $5 \times 10^{-5}$ |
| Ti/Al (20/150 nm) | 34 nm | 22% | 950° C. for 10 min in $N_2$ (with implantation) | $5 \times 10^{-6}$ |
| Ti/Ta/Al (thickness N.A.) | 16 nm | 35% | 950° C. for 4 min in $N_2$ | $5.1 \times 10^{-4}$ |
| Ta/Ti/Al (thickness N.A.) | 10 nm | 33% | 950° C. for 4 min in $N_2$ | $5.3 \times 10^{-7}$ |
| Ti/Al/Ni/Au (15/220/40/50 nm) | 30 nm | 24% | 800° C. for 60 s in Ar | $2.8 \times 10^{-6}$ |
| Ti/Al/Ni/Au (30/180/40/150 nm) | 18 nm | 25% | 900° C. for 30 s in $N_2$ | $7.3 \times 10^{-7}$ |
| Ti/Al/Pt/Au (15/85/50/50 nm) | 7.5 nm | 30% | 850° C. for 60 s in $N_2$ | $2.2 \times 10^{-6}$ |
| V/Al/Pt/Au (15/85/50/50 nm) | 7.5 nm | 30% | 850° C. for 60 s in $N_2$ | $1.0 \times 10^{-5}$ |
| Ti/Al/Pt/Au (20/100/40/80 nm) | 40 nm | 30% | 850° C. for 45 s in $N_2$ | $2 \times 10^{-5}$ |
| Ti/Al/Pt/W/Ti/Au (20/100/40/50/80 nm) | 40 nm | 30% | 850° C. for 45 s in $N_2$ | $1.6 \times 10^{-5}$ |
| Ti/Al/Pt/WSi/Ti/Au (20/100/40/50/80 nm) | 40 nm | 30% | 850° C. for 45 s in $N_2$ | $1.0 \times 10^{-5}$ |
| Ti/Al/Ir/Au (30/200/50/20 nm) | 40 nm | 30% | 850° C. for 30 s in $N_2$ | $4.6 \times 10^{-5}$ |
| Ti/Al/Nb/Au (15/60/35/50 nm) | 35 nm | 30% | 850° C. for 100 s in $N_2$ | $5 \times 10^{-6}$ |
| Ti/Al/Mo/Au (15/60/35/50 nm) | 25 nm | 20% | 800° C. in $N_2$ | $3 \times 10^{-6}$ |
| Mo/Al/Mo/Au (15/60/35/50 nm) | 25 nm | 20% | 650° C. in $N_2$ | $9 \times 10^{-7}$ |
| V/Al/Mo/Au (15/60/35/50 nm) | 25 nm | 20% | 700° C. in $N_2$ | $2.7 \times 10^{-6}$ |
| Ti/Al (30/120 nm) | 27 nm | 25% | 500° C. in $N_2$ | $4.7 \times 10^{-5}$ |
| Ti/Al/Ni/Au (30/120/40/50 nm) | 27 nm | 25% | 700° C. in $N_2$ | $6.5 \times 10^{-6}$ |
| Ta/Ti/Al/Ni/Au (10/30/120/40/50 nm) | 27 nm | 25% | 700° C. in $N_2$ | $7.5 \times 10^{-7}$ |
| Ti/Al/Mo/Au (15/60/35/50 nm) | 21.5 nm | 30% | 800° C. for 30 s in $N_2$ | $2.96 \times 10^{-7}$ |
| Ta/Al/Mo/Au (15/60/35/50 nm) | 21.5 nm | 30% | 800° C. for 30 s in $N_2$ | $1.09 \times 10^{-6}$ |
| Ti/Al/Mo/Au (15/60/35/50 nm) | 24 nm | 30% | 750° C. for 30 s in $N_2$ | $1.0 \times 10^{-6}$ |
| Ti/Al/Pt/Au (15/60/35/50 nm) | 24 nm | 30% | 750° C. for 30 s in $N_2$ | $1.5 \times 10^{-6}$ |
| Ti/Al/Ir/Au (15/60/35/50 nm) | 24 nm | 30% | 750° C. for 30 s in $N_2$ | $2.8 \times 10^{-6}$ |
| Ti/Al/Ni/Au (15/60/35/50 nm) | 24 nm | 30% | 750° C. for 30 s in $N_2$ | $1.5 \times 10^{-6}$ |
| Ti/Al/Ta/Au (15/60/35/50 nm) | 24 nm | 30% | 850° C. for 30 s in $N_2$ | $4.5 \times 10^{-6}$ |
| Ti/Al/Nb/Au (15/60/35/50 nm) | 24 nm | 30% | 850° C. for 30 s in $N_2$ | $3.5 \times 10^{-6}$ |
| Ti/Al/Ti/Au (15/60/35/50 nm) | 24 nm | 30% | 950° C. for 30 s in $N_2$ | $3.5 \times 10^{-6}$ |
| Ti/Al/Mo/Au (15/60/35/50 nm) | 21 nm | 28% | 850° C. for 30 s in $N_2$ | $2.96 \times 10^{-7}$ |
| Nb/Ti/Al/Ni/Au (10/20/100/40/50 nm) | 32 nm | 25% | 850° C. for 35 s in $N_2$ | $1.5 \times 10^{-5}$ |
| Nb/Ti/Al/Ni/Au (20/20/100/40/50 nm) | 32 nm | 25% | 850° C. for 35 s in $N_2$ | $3.7 \times 10^{-6}$ |
| Ti/Al/Ti/Au (20/80/40/100 nm) | 23 nm | 30% | 850° C. for 30 s in $N_2$ | $6.50 \times 10^{-6}$ |
| Ti/Al/Ni/Au (20/80/40/100 nm) | 23 nm | 30% | 850° C. for 30 s in $N_2$ | $2.50 \times 10^{-6}$ |
| Ti/Al/Ta/Au (20/80/40/100 nm) | 23 nm | 30% | 850° C. for 30 s in $N_2$ (with 50 nm SiN encapsulation layer) | $7.27 \times 10^{-7}$ |
| Ti/Al/Ni/Au (20/180/55/45 nm) | 22 nm | 21.5% | 870° C. for 50 s in $N_2$ | $2.13 \times 10^{-4}$ |
| Ti/Al/Ni/Au | 22 nm | 21.5% | 870° C. for 50 s in $N_2$ | $9.7 \times 10^{-7}$ |

TABLE 1-continued

Ohmic contacts to AlGaN/GaN heterostructures

| Metal Layers (nm) | $d_{AlGaN}$ (nm) | $\chi_{AL}$ (%) | Annealing conditions | $\rho$ ($\Omega cm^2$) |
|---|---|---|---|---|
| (20/120/55/45 nm) Ti/Al/Ni/Au (15/200/50/50 nm) | 50 nm | 22% | 850° C. for 60 s in Ar | $7.0 \times 10^{-5}$ |

TABLE 2

Au-free Ohmic contacts to AlGaN/GaN heterostructures

| Metal Layers (nm) | $d_{AlGaN}$ (nm) | $\chi_{AL}$ (%) | Annealing conditions | Contact resistance, $R_C$ ($\Omega mm$) |
|---|---|---|---|---|
| Ta/Al/Ta (10/280/20 nm) | 22 nm | 14% | 550° C. for 60 s in $N_2$ | 0.06 |
| Ta/Al/Ta (10/280/20 nm) | 25 nm | 25% | 600° C. for 60 s in $N_2$ | 0.28 |
| Ti/Al/Ti/TiN (thickness N.A.) | 10 nm | 25% | 550° C. for 90 s in $N_2$ | 1.25 |
| Ta/Al (70/200 nm) | 25 nm | 25% | 700° C. for 60 s in Ar | 36.3 |
| Ti/Al (70/200 nm) | 25 nm | 25% | 500° C. for 60 s in Ar | 1.8 |
| Ta/Si/Ti/Al/Ni/Ta (5/5/20/120/40/30 nm) | 18 nm | 26% | 850° C. for 30 s in $N_2$ | 0.22 |
| Ti/Al/W (60/100730 nm) | 17.5 nm | 26% | 870° C. for 30 s in $N_2$ | 0.49 |
| Ti/Al/W (20/100/20 nm) | 10 nm | 25% | 600° C. for 60 s in $N_2$ | 0.65 |
| Ti/Al/TiN (0.02x/x/60 nm) | 15 nm | 20% | 550° C. for 90 s in $N_2$ | 0.62 |
| Ti/Al/TiN (0.10x/x/60 nm) | 15 nm | 20% | 550° C. for 90 s in $N_2$ | 1.63 |
| Ti/Al/TiN (0.20x/x/60 nm) | 15 nm | 20% | 550° C. for 90 s in $N_2$ | 2.00 |

Figure 25:
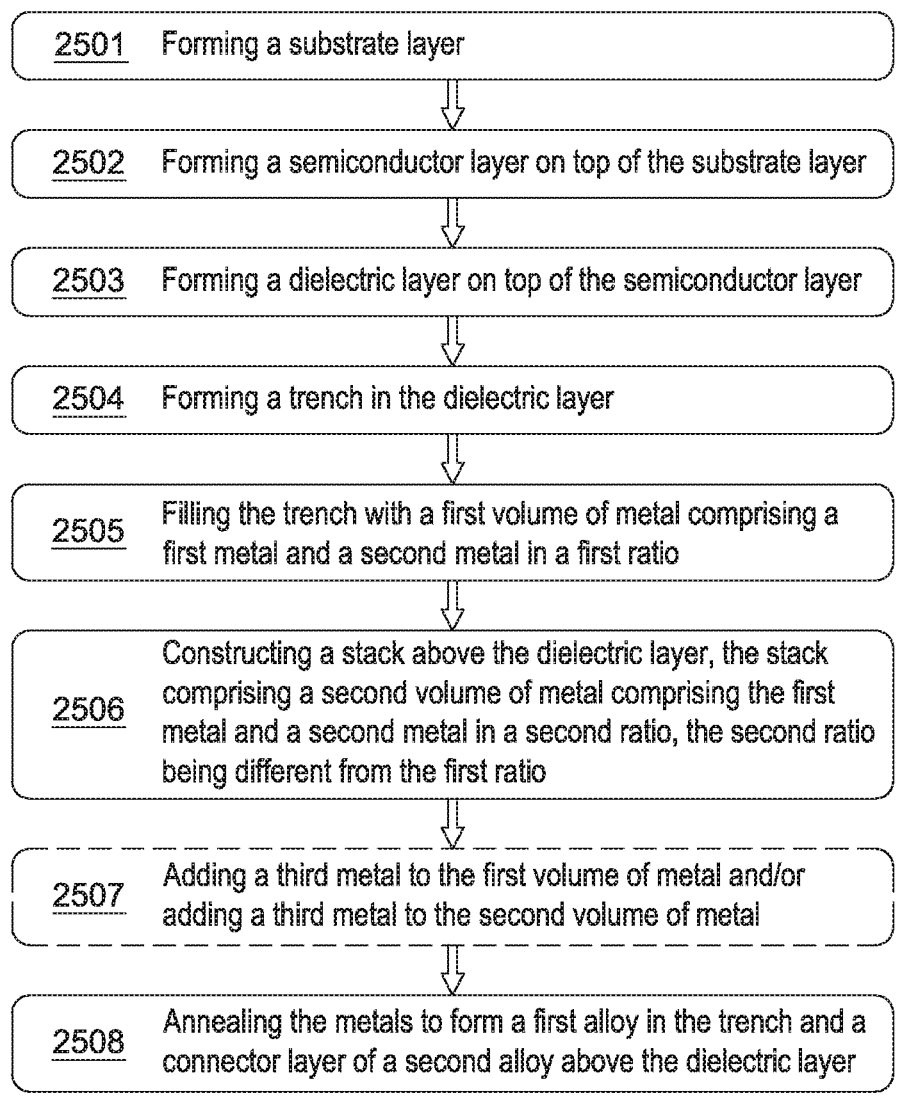
FIG. 25 is a flow chart illustrating a method of constructing an ohmic contact in a semiconductor section according to another embodiment of the invention.

FIG. 25 is a flow chart illustrating a method of constructing an ohmic contact in a semiconductor section according to another embodiment of the invention. The method comprises forming a substrate layer (2501), forming a semiconductor layer on top of the substrate layer (2502), forming a dielectric layer on top of the semiconductor layer (2503), and forming a trench in the dielectric layer (2504). The method further comprises filling the trench with a first volume of metal comprising a first metal and a second metal in a first ratio (2505), constructing a stack above the dielectric layer, the stack comprising a second volume of metal comprising the first metal and a second metal in a second ratio, the second ratio being different from the first ratio (2506), and then annealing the metals to form a first alloy in the trench and a connector layer of a second alloy above the dielectric layer (2508).

The method may optionally comprise adding a third metal to the first volume of metal and/or adding a third metal to the second volume of metal (2507).

Figure 26:
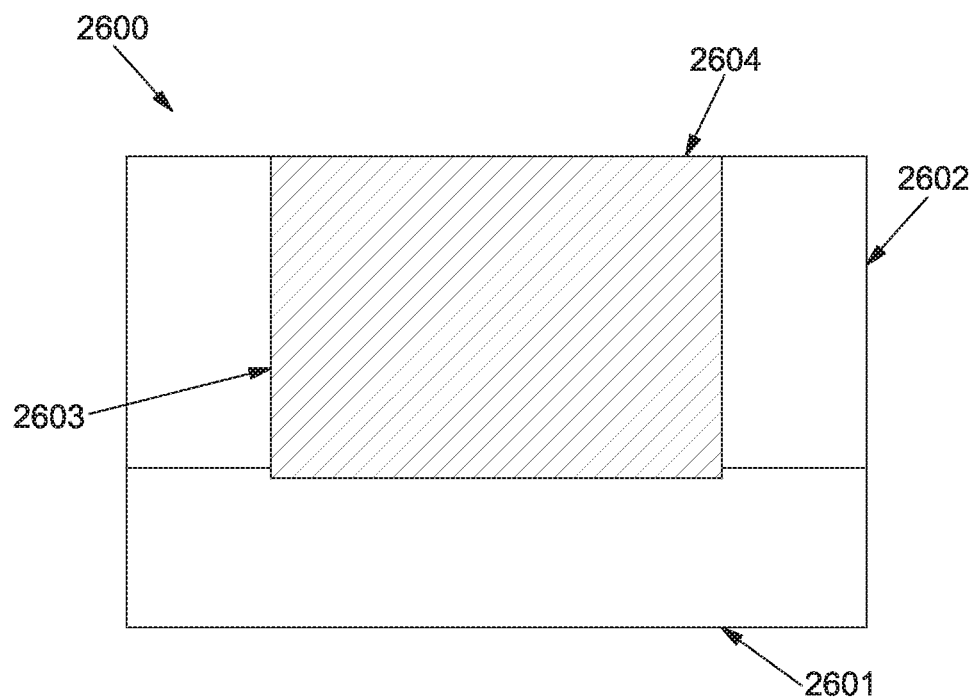
FIG. 26 is a cross sectional view of a semiconductor section illustrating the result of a first step of a method according to an embodiment.
Figure 27:
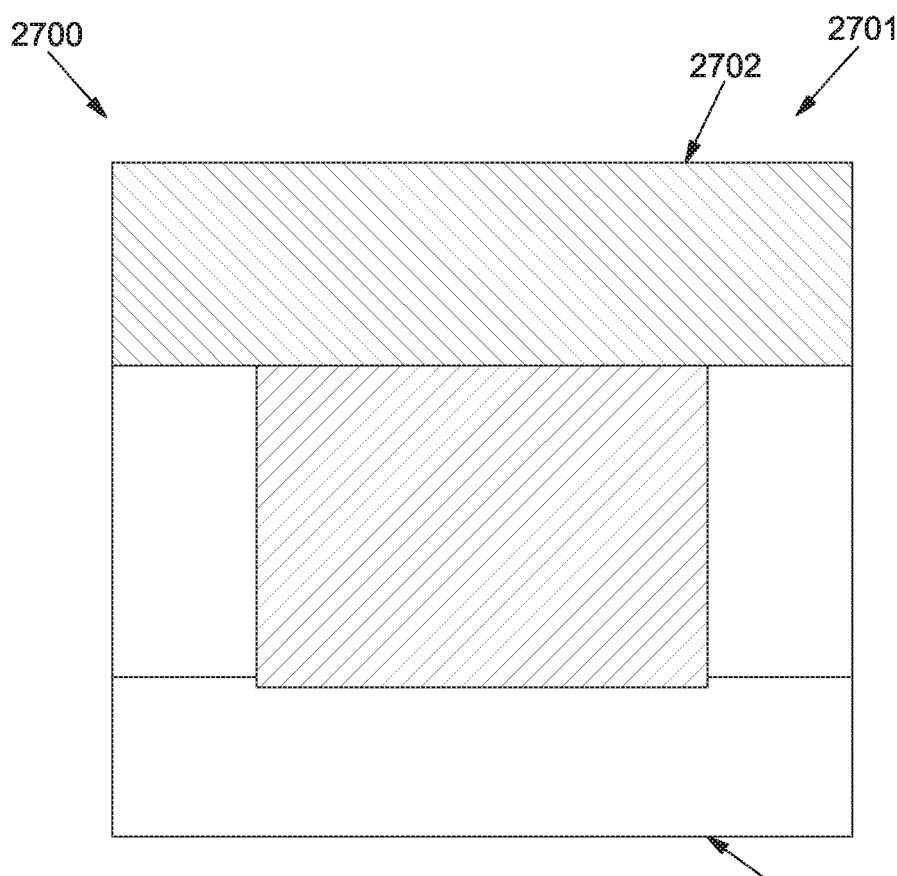
FIG. 27 is a cross sectional view of a semiconductor section illustrating the result of a second step of a method according to an embodiment.

The stages constructing of the ohmic contact are illustrated in FIGS. 26 and 27. FIG. 26 shows a cross sectional view of a semiconductor section 2600 with a semiconductor layer 2601, a dielectric layer 2602, and a trench 2603 in the semiconductor layer 2601 and the dielectric layer 2602. FIG. 26 shows the semiconductor section in a stage after the step (2505) of filling the trench 2601 with a first volume of metal 2604 comprising a first metal and a second metal.

FIG. 27 shows the semiconductor section 2700 at a stage after the step (2506) of constructing a stack 2701 comprising a second volume of metal 2702 comprising the first metal and the second metal.

Figure 28:
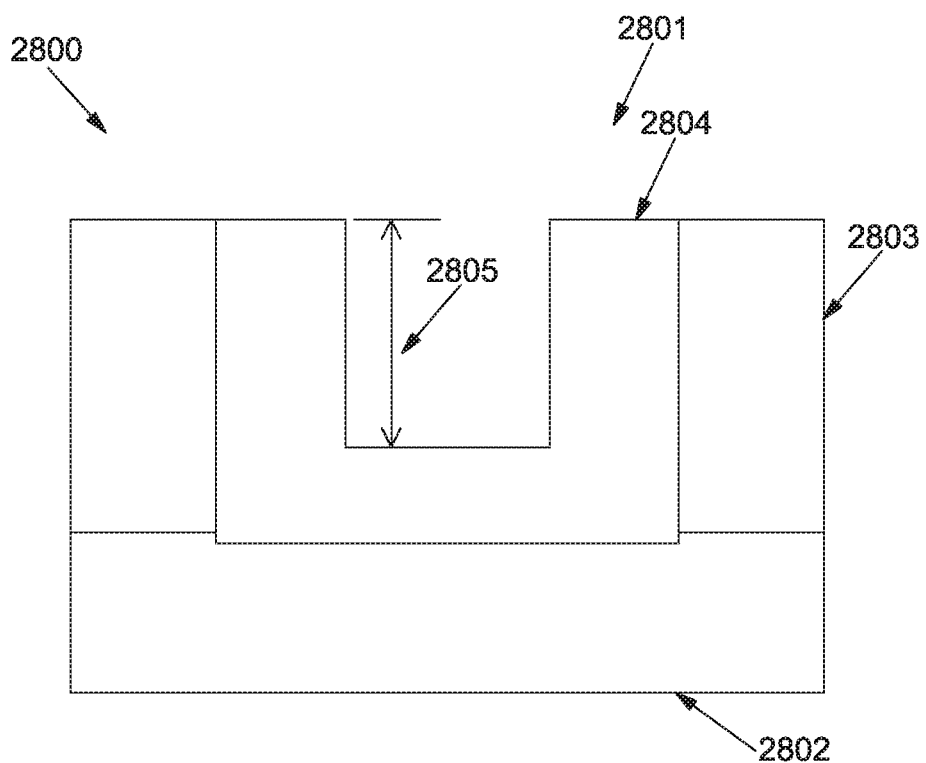
FIG. 28 is a cross sectional view of a semiconductor section illustrating the result of a first step of a method according to an embodiment.
Figure 29:
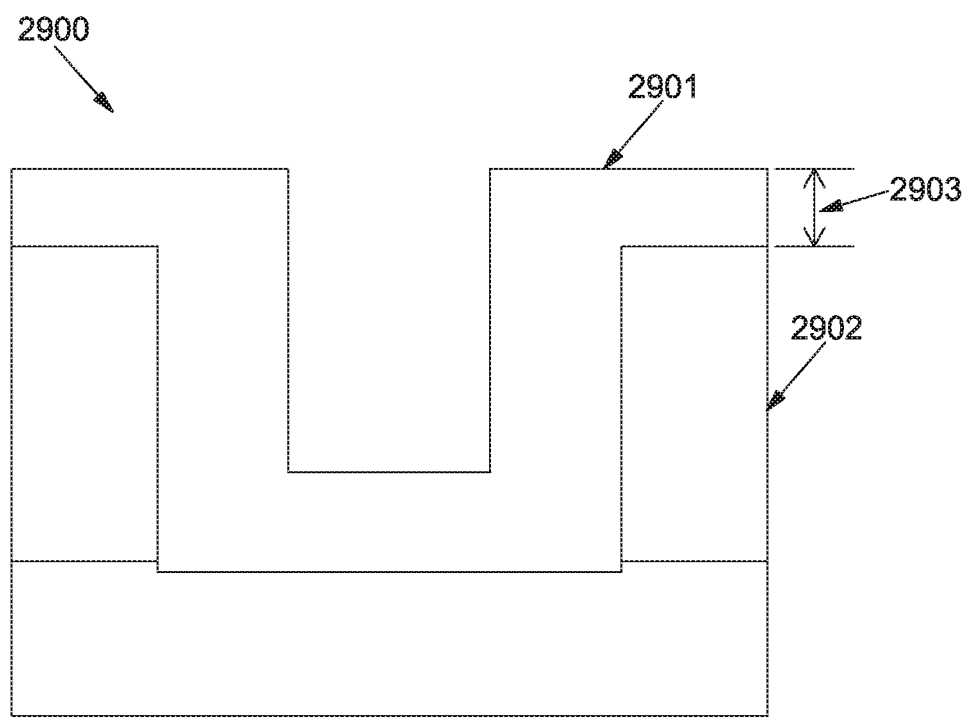
FIG. 29 is a cross sectional view of a semiconductor section illustrating the result of a second step of a method according to an embodiment.

FIG. 28 is a cross sectional view of a semiconductor section 2800 in a stage of a method according to an embodiment. The trench 2801 in the semiconductor layer 2802 and the dielectric layer 2803 is filled with a first metal 2804 to a first depth 2805. That is, the first volume of metal (in the trench 2801) has been partially filled with the first metal 2804 as part of the fifth step (2505). A third volume inside the trench 2801 remains unfilled. FIG. 29 shows a cross sectional view of the semiconductor section 2900 in a subsequent stage. A layer of the first metal 2901 is deposited on the dielectric layer 2902. The metal layer has a thickness 2903 above the dielectric layer 2902. That is, the second volume of metal (above the dielectric layer 2502) is partially filled with the first metal 2901 as part of the sixth step (2506).

Figure 30:
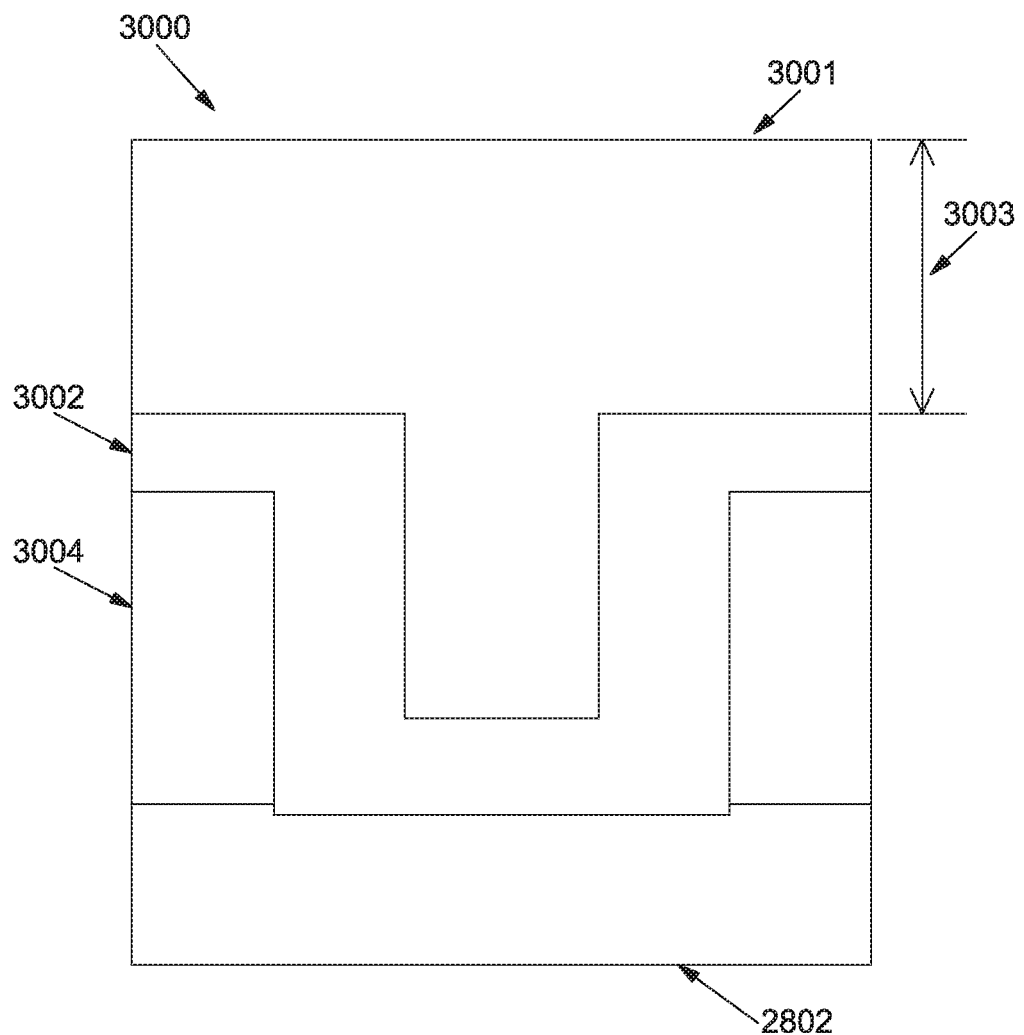
FIG. 30 is a cross sectional view of a semiconductor section illustrating the result of a third step of a method according to an embodiment.

FIG. 30 shows a cross sectional view of the semiconductor section 3000 after completing a further stage. A second metal layer 3001 is deposited on top of the first metal layer 3002 as part of the fifth (2505) and sixth (2506) steps of the method. The second metal layer 3001 has a thickness 3003 above the first metal layer 3002. The first volume of metal is filled with the first metal and the second metal in the trench, wherein the second metal fills the third volume (contained within the first volume). The second volume of metal comprises the first metal layer 3002 and the second metal layer 3001 above the dielectric layer 3004. After depositing the second metal layer 3001, the metals are annealed to form an alloy (2507).

Figure 31:
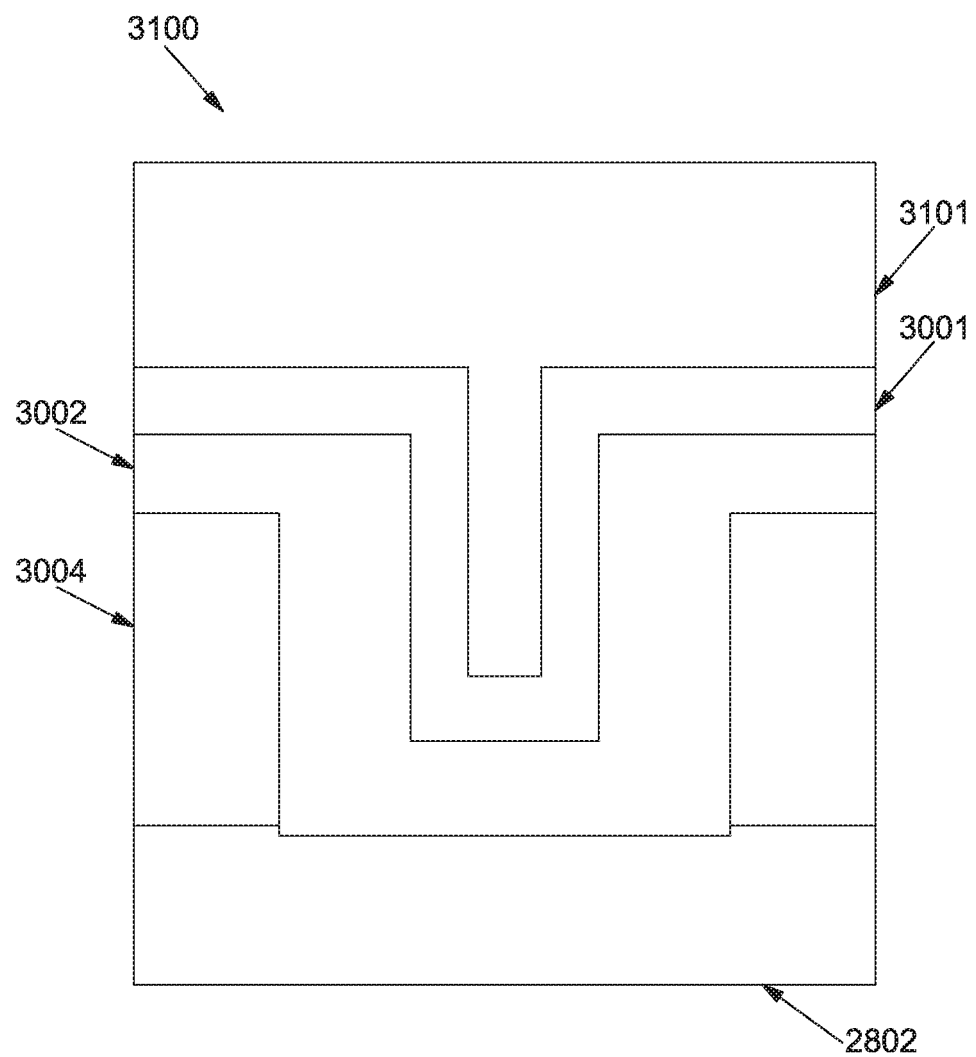
FIG. 31 is a cross sectional view of a semiconductor section at a stage before annealing according to another embodiment of the invention.

FIG. 31 shows a cross sectional view of the semiconductor section 3100 constructed according to the method illustrated in FIG. 25. The figure shows the stage directly preceding the step of annealing (2507). A third metal 3101 has been added to the first volume of metal and to the second volume of metal in the optional step (2507). Hence, FIGS. 30 and 31 show to alternative embodiments of filling (2505) the first metal volume and constructing (2506) the stack comprising the second metal volume according the method illustrated in FIG. 25. The present disclosure has mainly been described above with reference to a few embodiments. However, as is readily appreciated by a person skilled in the art, other embodiments than the ones disclosed above are equally possible within the scope of the present disclosure, as defined by the appended claims.

Described herein are the following numbered embodiments, which correspond with the claims of the priority application:

1. A semiconductor arrangement comprising:
   a substrate;
   a dielectric layer;
   a semiconductor layer disposed between the substrate and the dielectric layer;
   a plurality of trenches formed in the dielectric layer;
   a plurality of metal contacts located in said plurality of trenches; and
   a metallic connector layer electrically connecting said metal contacts.

2. A semiconductor arrangement according to embodiment 1, wherein said plurality of trenches are formed in the dielectric layer and the semiconductor layer.
3. A semiconductor arrangement according to embodiment 1 or 2, wherein at least one dimension of at least one of said metal contacts is substantially equal to a transfer length of an interface between the metal contact and said semiconductor layer.
4. A semiconductor arrangement according to any preceding embodiment, wherein said metal contacts comprise a first metal alloy.
5. A semiconductor arrangement according to embodiment 4, wherein the metallic connector layer comprises a second metal alloy.
6. A semiconductor arrangement according to embodiment 5, wherein the first metal alloy and the second metal alloy consist of the same component metals in different ratios.
7. A semiconductor arrangement according to any preceding embodiment, wherein the metal contacts are cylindrical.
8. A semiconductor arrangement according to any one of embodiments 1 to 6, wherein the metal contacts have a triangular profile.
9. A semiconductor arrangement according to any one of embodiments 1 to 6, wherein the metal contacts have a rectangular profile.
10. A semiconductor arrangement according to any one of embodiments 1 to 6, wherein the metal contacts have an obround profile.
11. A semiconductor arrangement according to any preceding embodiment, wherein said metal contacts are ohmic metal fragments.
12. A semiconductor device comprising a semiconductor arrangement according to any preceding embodiment.
13. A transistor comprising a semiconductor arrangement according to any one of embodiments 1 to 11.
14. A High Electron Mobility Transistor, HEMT, comprising a semiconductor arrangement according to any one of embodiments 1 to 12.
15. A method of constructing a semiconductor arrangement according to any of embodiments 1 to 14, the method comprising:
    forming a substrate layer;
    forming a semiconductor layer on top of the substrate layer;
    forming a dielectric layer on top of the semiconductor layer;
    forming a plurality of trenches in the dielectric layer;
    filling each of the plurality of trenches with a volume of metal comprising a first metal and a second metal in a defined ratio; and
    annealing the metals to form an alloy.
16. A method to embodiment 15, wherein said step of forming a plurality of trenches in the dielectric layer further comprises forming said trenches in the semiconductor layer.
17. A semiconductor arrangement comprising:
    a substrate layer, a semiconductor layer, a dielectric layer, and a connector layer, wherein the layers are disposed in the order: the substrate layer, the semiconductor layer, the dielectric layer, and the connector layer;
    a trench formed in the dielectric layer; and
    a metal contact located in said trench electrically connecting the connector layer and the semiconductor layer,
    wherein the connector layer comprises a first metal alloy, and the metal contact comprises a second metal alloy, and wherein the first metal alloy and the second metal alloy comprise a first metal and a second metal in different ratios.
18. A semiconductor arrangement according to embodiment 17, wherein said trench is formed in the dielectric layer and the semiconductor layer.
19. A method of manufacturing a semiconductor arrangement, the arrangement comprising a substrate layer, a semiconductor layer, a dielectric layer, and a connector layer, wherein the layers are disposed in the order: the substrate layer, the semiconductor layer, the dielectric layer, and the connector layer, the method comprising:
    forming a trench in the dielectric layer;
    forming within the trench a first layer of a first thickness on top of the semiconductor layer and a second layer of a second thickness on top of the first layer,
    wherein the first layer comprises a first metal, and the second layer comprises a first region disposed between a first trench wall and a first distance from the trench wall, a second region disposed between said first distance and a second distance from the trench wall, and a metal region disposed between said second distance and a second trench wall, wherein the first and third regions consist of the first metal and the second region consists of a second metal; and
    annealing the first and second metals to form an alloy.
20. A method according to embodiment 19, wherein said step of forming a trench in the dielectric layer further comprises forming said trench in the semiconductor layer.
21. A method according to embodiment 19 or 20, wherein the first thickness, the first distance and the second distance are equal.
22. A method according to any one of embodiment 19 to 21, wherein the second layer extends to a distance equal to the first thickness above an upper surface of the dielectric layer.
23. A method of manufacturing a semiconductor arrangement, the method comprising:
    forming a substrate layer;
    forming a semiconductor layer on top of the substrate layer;
    forming a dielectric layer on top of the semiconductor layer;
    forming a trench in the dielectric layer;
    filling the trench with a first volume of metal comprising a first metal and a second metal in a first ratio;
    constructing a stack above the dielectric layer, the stack comprising a second volume of metal comprising the first metal and a second metal in a second ratio, the second ratio being different from the first ratio; and
    annealing the metals to form a first alloy in the trench and a connector layer of a second alloy above the dielectric layer.
24. A method according to embodiment 23, wherein said step of forming a trench in the dielectric layer further comprises forming said trench in the semiconductor layer.
25. A method according to embodiment 23 or 24, wherein filling the trench with a first volume of metal comprises depositing a first layer of a first thickness comprising the first metal along a base of the trench, along a first wall of the trench, and along a second wall of the trench.
26. A method according to embodiment 25, wherein the filling further comprises filling a remaining unfilled volume with a third volume of metal comprising the second metal.

27. A method according to any of embodiments 23 to 26, further comprising adding a third metal to the first volume of metal.
28. A method according to any of embodiments 23 to 27, further comprising adding a third metal to the second volume of metal.

Having described the invention in detail and by reference to the various embodiments, it should be understood that modifications and variations thereof are possible without departing from the scope of the claims of the present application.

What is claimed is:

1. A semiconductor arrangement comprising:
   a substrate;
   a dielectric layer;
   a semiconductor layer disposed between the substrate and the dielectric layer;
   an ohmic contact comprising a plurality of metal contact fragments located in a plurality of trenches formed in said dielectric layer; and
   a metallic connector layer in direct contact with and electrically connecting said metal contact fragments, wherein said ohmic contact electrically connects said metallic connector layer to said semiconductor layer, wherein said metal contact fragments comprise a first metal alloy and said connector layer comprises a second metal alloy, and wherein said first metal alloy and said second metal alloy consist of the same component metals in different ratios;
   wherein said metal contact fragments are arranged in a single row perpendicular to a direction of current travelling to or from the ohmic contact when in use; and
   wherein a spacing between immediately adjacent metal contact fragments in the row is in the range of 0.1 to 10 times a transfer length of an interface between the metal contact fragments and said semiconductor layer.

2. A semiconductor arrangement according to claim 1, wherein said plurality of trenches are formed in the dielectric layer and in the semiconductor layer.

3. A semiconductor arrangement according to claim 1, wherein a dimension of one or more of said metal contact fragments is substantially equal to a transfer length of an interface between the metal contact fragments and said semiconductor layer.

4. A semiconductor arrangement according to claim 3, wherein said dimension is within 10% of the transfer length.

5. A semiconductor arrangement according to claim 3, wherein said dimension is a length of the fragments in a lateral direction parallel to a current traveling to or from the ohmic contact when in use.

6. A semiconductor arrangement according to claim 1, wherein the metal contact fragments are cylindrical.

7. A semiconductor arrangement according to claim 1, wherein the metal contact fragments have a triangular profile.

8. A semiconductor arrangement according to claim 1, wherein the metal contact fragments have a rectangular profile.

9. A semiconductor arrangement according to claim 1, wherein the metal contact fragments have an obround profile.

10. A semiconductor device comprising a semiconductor arrangement according claim 1.

11. A transistor comprising a semiconductor arrangement according to claim 1.

12. A High Electron Mobility Transistor, HEMT, comprising a semiconductor arrangement according to claim 1.

13. A semiconductor arrangement according to claim 1, wherein the plurality of metal contact fragments together comprise either a source or drain.

14. A semiconductor arrangement according to claim 1, wherein the substrate is positioned at a bottom of the arrangement, and wherein the metallic connector layer is positioned below the plurality of metal contact fragments.

15. A semiconductor arrangement according to claim 1, wherein the metallic connector layer extends continuously to the metal contact fragments to directly electrically couple the metal contact fragments by an inherently electrically conductive material.

* * * * *